US009645488B2

(12) United States Patent
Inoue

(10) Patent No.: US 9,645,488 B2
(45) Date of Patent: May 9, 2017

(54) POSITION MEASURING METHOD, MISPLACEMENT MAP GENERATING METHOD, AND INSPECTION SYSTEM

(71) Applicant: NuFlare Technology, Inc., Yokohama (JP)

(72) Inventor: Hiromu Inoue, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/814,793

(22) Filed: Jul. 31, 2015

(65) Prior Publication Data

US 2016/0034632 A1    Feb. 4, 2016

(30) Foreign Application Priority Data

Aug. 4, 2014  (JP) ................................. 2014-159062

(51) Int. Cl.
*G06F 17/50* (2006.01)
*G03F 1/84* (2012.01)

(52) U.S. Cl.
CPC ..................................... *G03F 1/84* (2013.01)

(58) Field of Classification Search
CPC ..... G03F 1/36; G03F 1/84; G03F 1/38; G03F 7/70441; G03F 9/7088; G03F 1/42; G03F 7/70191; G06F 17/5081
USPC ........................... 716/50–55, 139; 430/5, 30
See application file for complete search history.

(56) References Cited

U.S. PATENT DOCUMENTS

| | | | |
|---|---|---|---|
| 6,883,158 B1* | 4/2005 | Sandstrom | G03F 7/704 430/5 |
| 2012/0225374 A1 | 9/2012 | Okuda et al. | |
| 2013/0216120 A1 | 8/2013 | Inoue et al. | |
| 2013/0298088 A1* | 11/2013 | Lee | G03F 1/72 716/52 |

FOREIGN PATENT DOCUMENTS

| | | |
|---|---|---|
| JP | 2003-279319 A | 10/2003 |
| JP | 4236825 | 3/2009 |
| JP | 2012-181426 A | 9/2012 |
| JP | 2013-64632 A | 4/2013 |
| JP | 2013-167608 A | 8/2013 |

* cited by examiner

*Primary Examiner* — Nghia Doan
(74) *Attorney, Agent, or Firm* — Oblon, McClelland, Maier & Neustadt, L.L.P.

(57) ABSTRACT

In a position measuring method, a mask including first patterns to be transferred and second patterns not to be transferred is prepared. The position coordinates of the second patterns are measured with a position measuring apparatus and an inspection system. First position correction data is generated based on the position coordinates of the second patterns. A difference is obtained between the measured position coordinates of the second patterns and the first position correction data is corrected using the obtained difference. Second position correction data is generated from the corrected first position correction data. An optical image including the position coordinates of the first and second patterns is acquired. The position coordinates of the first patterns of the optical image are corrected using a difference between the position coordinates of the second patterns of the optical image and of the second patterns based on the second position correction data.

13 Claims, 13 Drawing Sheets

POSITION MEASURING METHOD, MISPLACEMENT MAP GENERATING METHOD, AND INSPECTION SYSTEM

CROSS-REFERENCE TO THE RELATED APPLICATION

The entire disclosure of the Japanese Patent Application No. 2014-159062, filed on Aug. 4, 2014 including specification, claims, drawings, and summary, on which the Convention priority of the present application is based, are incorporated herein in its entirety.

FIELD OF THE INVENTION

The present invention relates to a position measuring method, a misplacement map generating method, and an inspection system.

BACKGROUND

In a production process of a semiconductor element, by using an original image pattern (that is, a mask or a reticle, hereinafter collectively referred to as a mask) in which a circuit pattern is formed, the pattern is exposed and transferred onto a wafer by a reduction projection exposure apparatus, called a stepper or a scanner, to form a circuit on the wafer, thereby producing a semiconductor element.

With high integration and large capacity of recent Large Scale Integration (LSI), a circuit dimension required for a semiconductor element has become increasingly narrowed. Thereby high accuracy is required for a pattern formed in a mask. Accordingly it is necessary to detect a defect of an extremely small pattern in a mask inspection. Japanese Patent No. 4236825 discloses an example of the conventional inspection apparatus.

In order to accurately inspect a pattern formed in a mask, it is necessary to accurately measure a position coordinate of the pattern over the whole surface of the mask. It is also necessary to measure the position coordinate of the pattern in the mask, to obtain a distribution map of a misplacement amount between the measurement value of a position coordinate and a design position coordinate, and to feed back the distribution map to a mask producing process.

Conventionally, the position coordinate of a mark arranged around the pattern is measured with a dedicated position measuring apparatus such as a CD-SEM, and the position coordinate of the pattern is predicted from the measurement value of a position coordinate of the mark to perform the inspection. However, there are few marks because the space where the mark can be arranged on the surface of the mask is restrictive. Accordingly there is a problem in that the position coordinate of the pattern may not be accurately obtained over the whole surface of the mask.

There is also a known method for acquiring the position coordinate of the pattern, using an image for inspecting that is acquired by a pattern inspection apparatus. In this method, based on an optical image of the mask pattern, the position coordinate of the pattern is obtained by referring to a reference image that is generated from the design pattern. However, because this process is performed during an inspection process, a fluctuation of the measurement value of a position coordinate of the pattern may be generated as a result of, thermal expansion of the mask irradiated with inspection light for a long time, a fluctuation of an air flow in the inspection apparatus, or a measurement error of a length measuring system due to various heat sources of the inspection apparatus.

Further, it is conceivable that the position coordinate of the pattern obtained from the image obtained in the inspection process is corrected using the position coordinate measured with the position measuring apparatus. However, because the position measured with the position measuring apparatus is locally determined, as described above, the position coordinate of the pattern arranged in a non-measured region is insufficiently corrected.

The present invention has been devised to solve the problem described above. An object of the present invention is to provide a position measuring method for being able to accurately obtain the position of the pattern to be inspected.

Another object of the present invention is to provide a method for producing an accurate misplacement map associated with the position of the pattern to be inspected.

Another object of the present invention is to provide an inspection system that can generate an accurate misplacement map associated with the position of the pattern to be inspected.

Further, other objects and advantages of the present invention are apparent from the following description.

SUMMARY OF THE INVENTION

According to one aspect of the present invention, a position measuring method includes preparing a mask including a plurality of first patterns to be transferred to a subject and a plurality of second patterns not to be transferred to the subject. The position coordinates of the plurality of second patterns are measured with a position measuring apparatus. The position coordinates of the plurality of second patterns are measured with an inspection system. First position correction data is generated based on the position coordinates of the plurality of second patterns measured with the inspection system. A difference is obtained between the position coordinates of the plurality of second patterns measured with the position measuring apparatus and the position coordinates of the plurality of second patterns measured with the inspection system, and the first position correction data is corrected using the obtained difference. Second position correction data is generated from the corrected first position correction data. An optical image is acquired including the position coordinates of the plurality of first patterns and the position coordinates of the plurality of second patterns, and the position coordinates of the plurality of first patterns of the optical image are corrected using a difference between the position coordinates of the plurality of second patterns of the optical image and the position coordinates of the plurality of second patterns based on the second position correction data.

According to another aspect of the present invention, a position measuring method includes preparing a mask including a plurality of first patterns to be transferred to a subject and a plurality of second patterns, wherein the plurality of second patterns are arranged in a region where the plurality of first patterns are arranged, and in a region surrounding the region where the plurality of first patterns are arranged, and wherein the plurality of second patterns are not transferred to the subject. Position coordinates of the second patterns are measured with a position measuring apparatus, and the mask is positioned on a table configured to be movable in an X-axis direction and a Y-axis direction. Optical images are acquired of the plurality of second patterns while measuring a position coordinate of the table, and generating first position correction data with respect to the plurality of first patterns based on a measurement value obtained by measuring position coordinates of the plurality of second patterns. The first position correction data is corrected based on the position coordinates of the plurality of second patterns measured with the position measuring apparatus and second position correction is generated data based on the corrected first position correction data. Optical images are acquired of the plurality of first patterns and optical images of the plurality of second patterns while measuring the position coordinate of the table during a defect inspection of the plurality of first patterns, and the position coordinates of the plurality of first patterns and the position coordinates of the plurality of second patterns are obtained from the position coordinate of the table, the optical images of the plurality of first patterns, and the optical images of the plurality of second patterns. A plurality of reference images are generated based on design data corresponding to the plurality of first patterns, and a plurality of reference images based on design data corresponding to the plurality of second patterns. The position coordinates of the plurality of first patterns are obtained from the reference images of the plurality of first patterns, and the position coordinates of the plurality of second patterns from the reference images of the plurality of second patterns. Misplacement amounts are obtained of the plurality of first patterns between the position coordinates obtained from the optical images and the position coordinates obtained from the reference images, and misplacement amounts of the plurality of second patterns between the position coordinates obtained from the optical images and the position coordinates obtained from the reference images. A difference between the misplacement amounts of the plurality of second patterns and the misplacement amounts of the plurality of second patterns of the second position correction data is obtained, and the difference is added to or subtracted from the difference from the misplacement amounts of the plurality of first patterns to correct the misplacement amounts of the plurality of first patterns. The position coordinates of the plurality of first patterns are corrected using the corrected misplacement amounts, and a position of the first pattern is set to the corrected position.

According to another aspect of the present invention, a misalignment map generating method includes preparing a mask including a plurality of first patterns to be transferred to a subject and a plurality of second patterns, wherein the plurality of second patterns are arranged in a region where the plurality of first patterns are arranged, and in a region surrounding the region where the plurality of first patterns are arranged, and wherein the plurality of second patterns are not transferred to the subject. The position coordinates of the second patterns are measured with a position measuring apparatus, and the mask is positioned on a table configured to be movable in an X-axis direction and a Y-axis direction. Optical images of the plurality of second patterns are acquired while measuring a position coordinate of the table, and first position correction data is generated with respect to the plurality of first patterns based on a measurement value obtained by measuring position coordinates of the plurality of second patterns. The first position correction data is corrected based on the position coordinates of the plurality of second patterns measured with the position measuring apparatus, and second position correction data is generated from the corrected first position correction data. Optical images are acquired of the plurality of first patterns and the plurality of second patterns while measuring the position coordinate of the table during a defect inspection of the plurality of first patterns. Position coordinates of the plurality of first patterns and the position coordinates of the plurality of second patterns are obtained from the position coordinate of the table, the optical images of the plurality of first patterns, and the optical images of the plurality of second patterns. A map of the misplacement amount is generated from the design coordinates of the pluralities of first and second patterns, the misplacement amounts being associated with the position coordinates on the surface of the mask, and a difference is obtained between the misplacement amount from the map of the misplacement amount and the misplacement amount of the second position correction data with respect to the plurality of second patterns, and adding the difference to or subtracting the difference from the misplacement amounts of the plurality of first patterns to correct the map of the misplacement amount.

According to another aspect of the present invention, an inspection system includes, a table, a position measuring unit, an optical image acquiring unit, a reference image generating unit, a map generating unit, a position correction data producing unit, a map correction unit, and a comparison unit. The table is movable in an X-axis direction and a Y-axis direction, and the position measuring unit measures a position coordinate of the table. The optical image acquiring unit acquires an optical image of an inspection target on the table, and the reference image generating unit generates a reference image corresponding to the optical image from design data of a pattern arranged in the inspection target. The map generating unit obtains position coordinates of a plurality of first patterns and position coordinates of a plurality of second patterns from optical images of a plurality of first patterns of the inspection target, and optical images of a plurality of second patterns, wherein the plurality of second patterns are arranged in a region where the plurality of first patterns are arranged, and in a region surrounding the region where the plurality of first patterns are arranged, and the position coordinate of the table measured during acquisition of these optical images, and generate a map of the misplacement amounts of each position coordinate of the plurality of first patterns and the plurality of second patterns from design coordinates, the misplacement amounts being associated with position coordinates on the surface of the inspection target in the map of the misplacement amount. The position correction data producing unit generates first position correction data with respect to the plurality of first patterns by calculating the misplacement amounts between the optical images of the plurality of second patterns, the optical images of the plurality of second patterns acquired separately from the plurality of first patterns, and the reference image generated from design data of the second pattern corresponding to the optical image, and generate second position correction data by correcting the first position correction data based on the position coordinate of the second pattern measured with a position measuring apparatus. The map correction unit that is a part of the map generating unit or independent from the map generating unit, to obtain a difference between the misplacement amount from the map of the misplacement amount and the misplacement amount from the second position correction data with respect to the plurality of second patterns, and correct the map of the misplacement amount by adding the difference to or subtracting the difference from the misplacement amounts of the plurality of first patterns. The comparison unit configured to compare the optical image of the first pattern with the reference image of the first pattern, and determine the existence of a defect in the case where a difference value between the optical image and the reference image is larger than a predetermined threshold value.

DETAILED DESCRIPTION OF THE EMBODIMENT

In the following embodiments "position measuring pattern" means a pattern for measuring a position, and "correction data" means data that is used to correct either a position coordinate, a misplacement amount, or a misplacement map.

First Embodiment (Position Measuring Method)

A position measuring method for accurately obtaining a position of a pattern formed in a mask will be described in the present embodiment.

Figure 1:
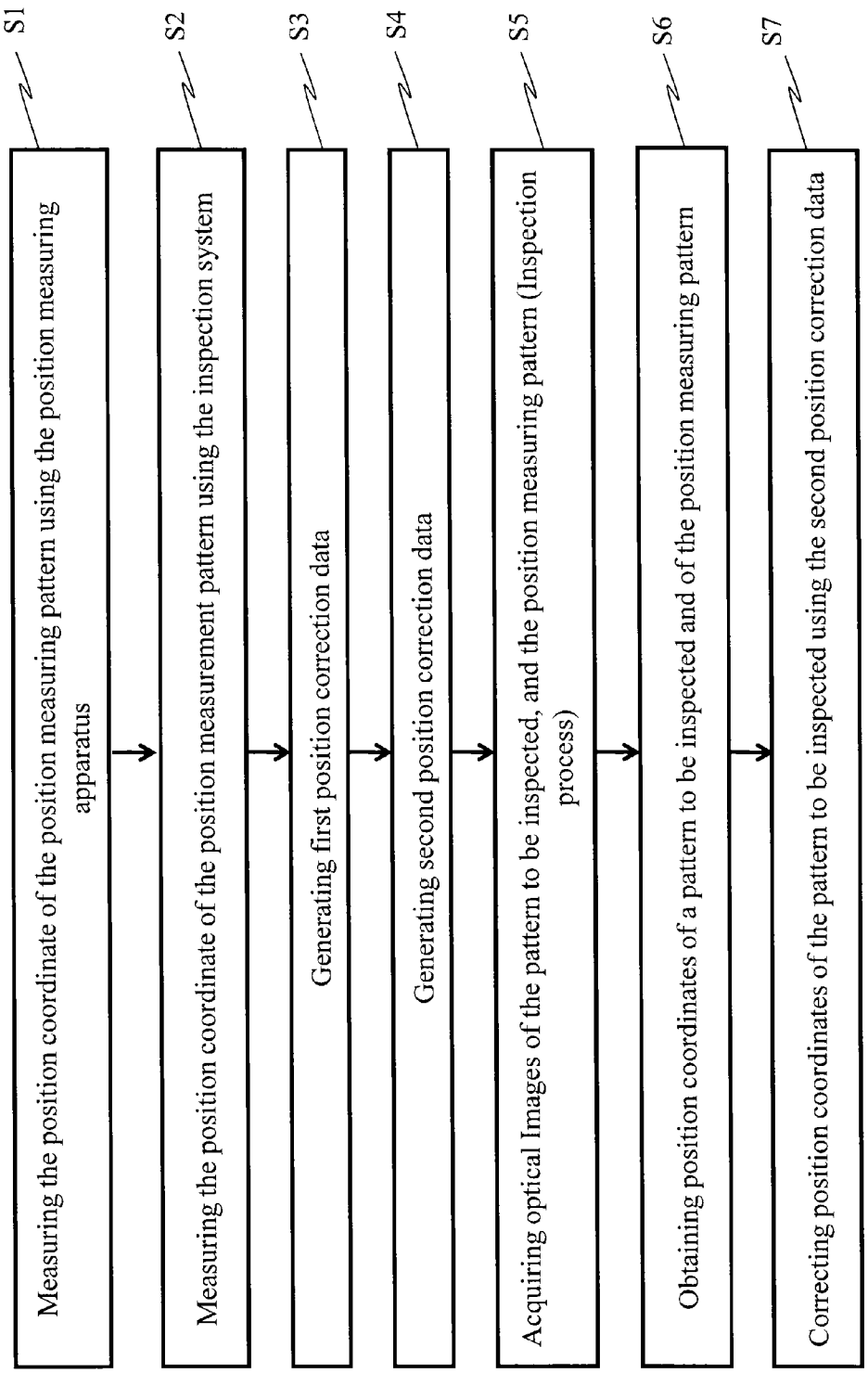
FIG. 1 is one example of a flowchart of the position measuring method according to the first embodiment.

FIG. 1 is a flowchart of the position measuring method according to the present embodiment.

As illustrated in FIG. 1, in the position measuring method of the first embodiment, a position measuring apparatus measures a position coordinate of a position measuring pattern formed in a mask 101 (S1). Using an inspection system, an optical image of the position measuring pattern is obtained, while a position coordinate of a table on which the mask 101 is positioned, is measured, and the position coordinate of the position measuring pattern is obtained from the measurement value of a position coordinate of the table and the optical image of the position measuring pattern (S2). In S1, the mask 101 includes plural patterns to be inspected (to be described in detail later) transferred to a wafer and plural position measuring patterns that are not substantially transferred to the wafer. The plural position measuring patterns are formed in a region where the plural patterns to be inspected are formed and in the region surrounding the region where the plural patterns to be inspected are formed. Accordingly, the position measuring method of the first embodiment includes a process of preparing the mask 101 including the plural patterns to be inspected and the plural position measuring patterns in advance of S1.

Then, using the measurement value of the position coordinates of the plural position measuring patterns measured in S2, the plural measurement values are associated to generate first position correction data (S3). Using a difference between the measurement values of the position coordinates of the plural position measuring patterns, measured using the position measuring apparatus in S1, and the measurement values of the position coordinates obtained by acquiring the optical images in S2 for the plural position measuring patterns, the first position correction data is corrected to generate second position correction data (S4).

Then, in a process of inspecting the pattern to be inspected, using the inspection system, the optical image of the pattern to be inspected is obtained for the purpose of a defect inspection while the position coordinate of the table is measured, and an optical image of the position measuring pattern is also obtained at the same time (S5). The position coordinate of the pattern to be inspected and the position coordinate of the position measuring pattern are obtained from the measurement value of a position coordinate of the table and the optical image obtained in S5 (S6). Because these measurement values of position coordinates include an error caused by an environmental fluctuation in the inspection system, the measurement values of position coordinates are corrected using the second position correction data (S7).

The position measuring method of the first embodiment includes the processes in S1 to S7, and the position of the pattern to be inspected of the prepared mask can correctly be obtained. An outline of the inspection system that inspects a defect of the mask in which the position of the pattern to be inspected is measured and a defect of the pattern to be inspected on the mask, and the detailed processes (S1 to S7) of the position measuring method of the first embodiment in FIG. 1 will be described below.

For example, the plural patterns to be inspected (first pattern) constructed with plural geometrical patterns are formed in the mask in which the position is measured by the position measuring method of the first embodiment. Because existence or non-existence of the defect of the pattern to be inspected is checked in the mask inspection process, it is necessary to accurately obtain the position coordinate of the pattern to be inspected. Therefore, the plural position measuring patterns (second patterns) used to obtain the position coordinate of the pattern to be inspected is formed in the mask in addition to the pattern to be inspected.

A circuit pattern transferred to the wafer can be included in an example of a pattern to be inspected. The pattern to be inspected may also include an auxiliary pattern. The auxiliary pattern is not transferred to the wafer, but provided adjacent to the circuit pattern in order to improve resolution of the circuit pattern. In the first embodiment, by way of example, the wafer is described as a target object to which the pattern to be inspected is transferred. However, the target object is not limited to the wafer. For example, a glass substrate may be used as the target object.

The position measuring pattern is the pattern that is not substantially transferred to the wafer, and is used for measuring the position on the surface of the mask. "The pattern that is not substantially transferred" means a pattern that is not transferred to the wafer, or a pattern that does not affect the performance of a semiconductor element even if it is transferred to the wafer.

Although the position measuring pattern can be formed into any shape, it is preferable that the position measuring pattern is formed into a line pattern, it is more preferable that the position measuring pattern is formed into a shape in which a line pattern extending in one direction and a line pattern extending in a different direction are combined. The position of the position measuring pattern can be obtained by detecting an edge position of the line pattern, and detection accuracy can be improved by detecting an edge position of the line pattern extending in the different direction. A cross pattern 147 in FIG. 5 can be included in an example of the position measuring pattern. In this case, the edge positions in an X-direction and a Y-direction can be detected.

Figure 2:
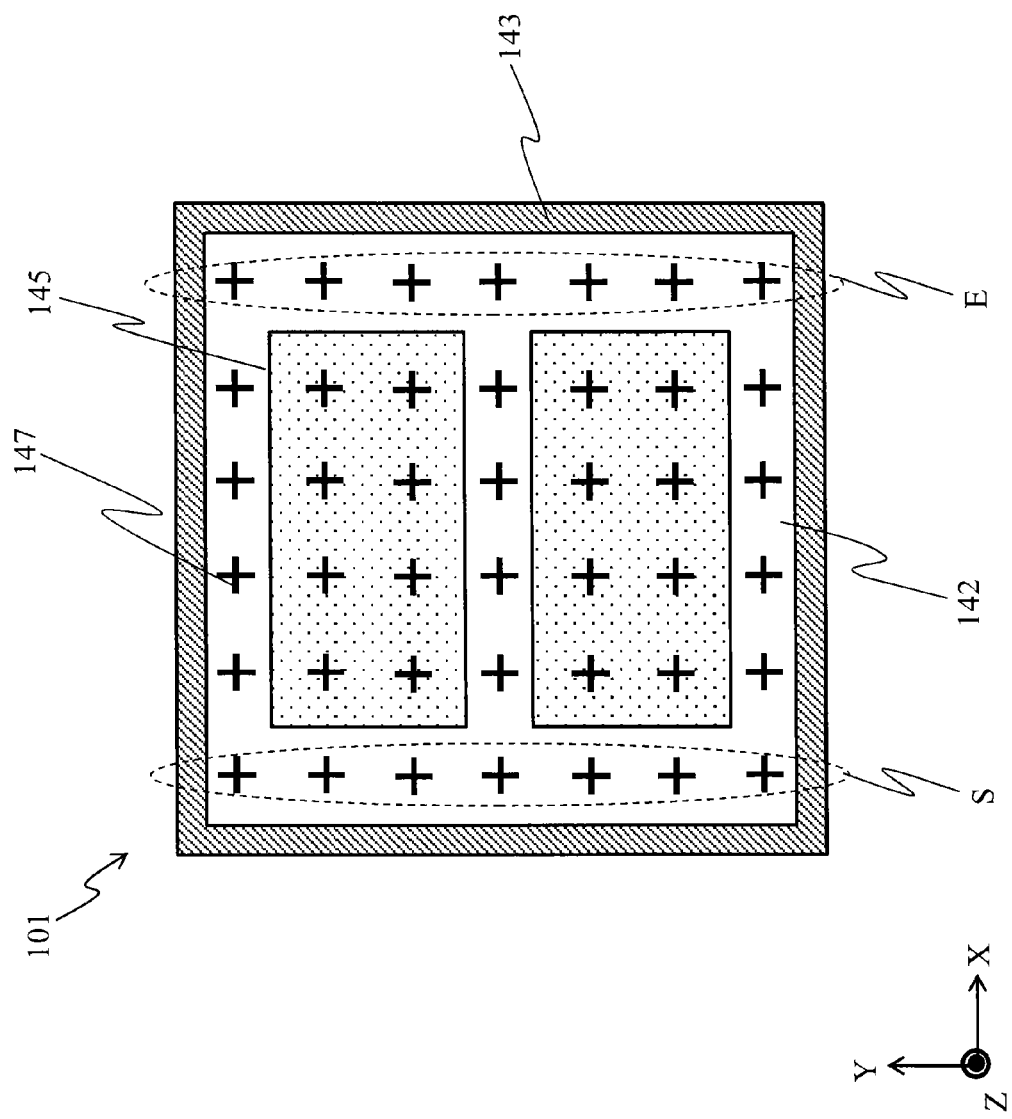
FIG. 2 is a schematic plane view of the mask according to the first embodiment.
Figure 3:
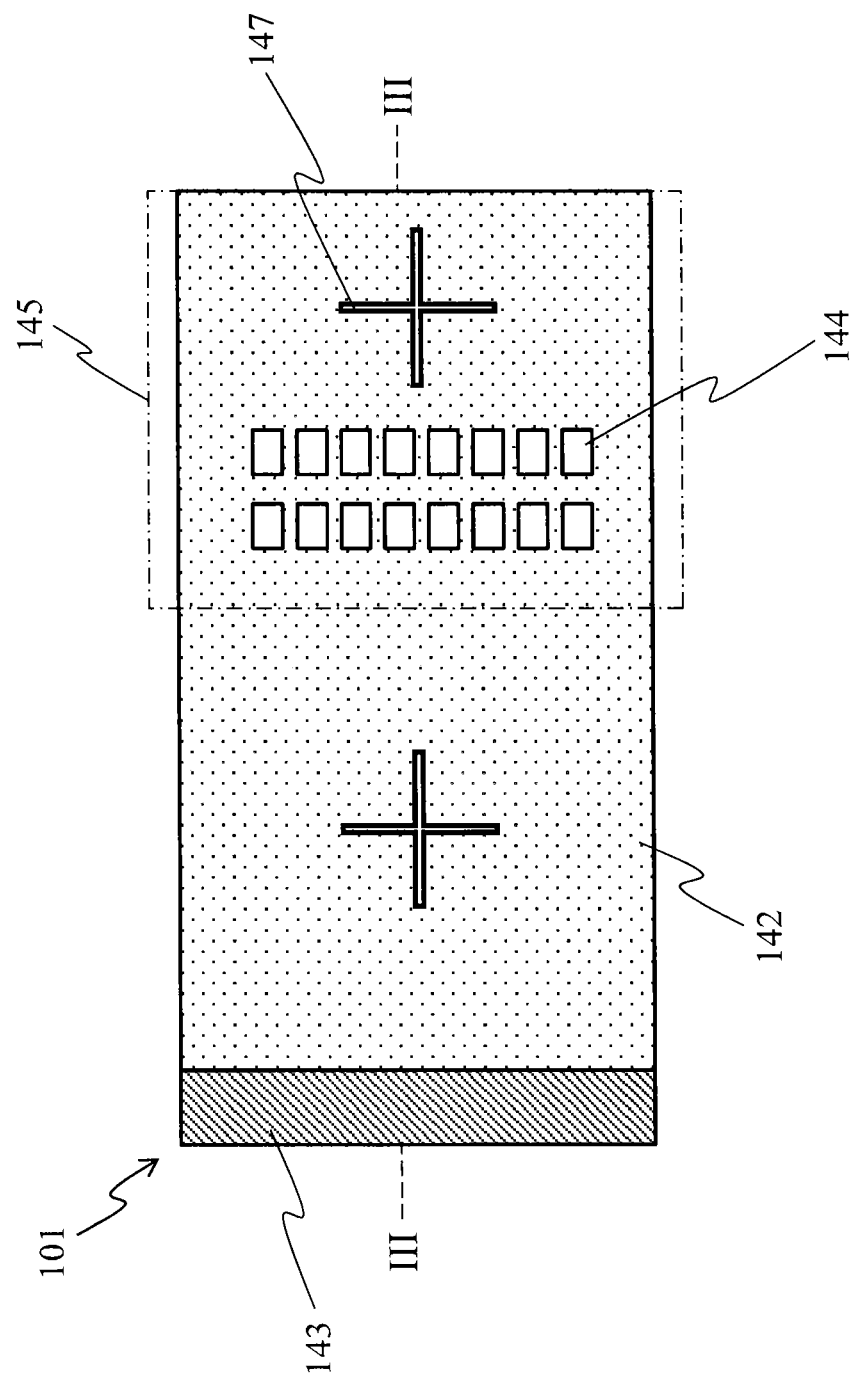
FIG. 3 is a partially enlarged view of FIG. 2.

FIG. 2 is a schematic plane view of the mask 101. FIG. 3 is a partially enlarged view of FIG. 2. The pattern to be inspected (indicated by a symbol 144 in FIG. 3 although not illustrated in FIG. 2) exposed and transferred onto the wafer is generally formed on the center side of the substrate. In the first embodiment, a region where the pattern to be inspected 144 is formed is referred to as a pattern forming region 145.

Figure 4:
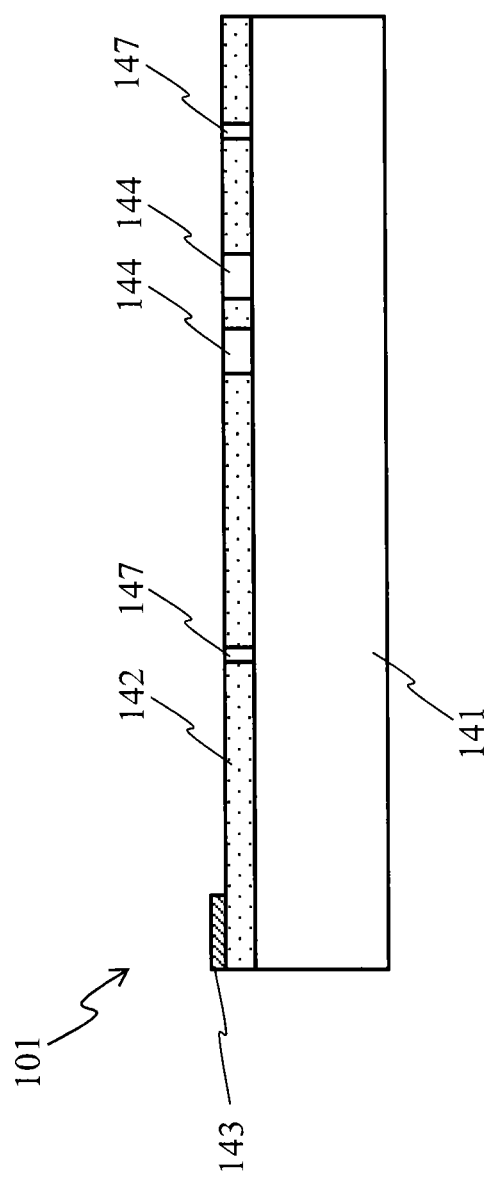
FIG. 4 is a cross-sectional view of the mask taken along the line of FIG. 3.

FIG. 4 is a cross-sectional view of the mask taken along the line of FIG. 3. As illustrated in FIG. 4, the mask 101 includes a substrate 141, a first film 142 that is provided in one of principal surfaces of the substrate 141, and a second film 143 that is provided in a peripheral portion of the first film 142. The substrate 141 is made of a material, such as quartz glass, which has high translucency. The first film 142 is a halftone film made of a material having transmittance lower than that of the substrate 141. For example, the first film 142 is made of materials such as a chromium fluoride (CrF) based materials, a molybdenum silicide (MoSiON, MoSiO) based materials, a tungsten silicide (WSiO) based materials, and a zirconium silicide (ZrSiO) based materials, and the first film 142 has the transmittance for deep ultraviolet light of several percent. The second film 143 is provided in the peripheral region of the substrate 141 so as to cover the first film 142. For example, the second film 143 is formed by a chromium (Cr) film.

The pattern to be inspected 144 is formed in the first film 142. As illustrated in FIG. 4, the pattern to be inspected 144 is an opening that is formed by selectively removing the first film 142.

The position measuring pattern 147 is also formed in the first film 142. However, while the pattern to be inspected 144 is restricted to the pattern forming region 145 of the first film 142, the position measuring pattern 147 is formed over the whole surface of the first film 142 except for the substrate peripheral region, more particularly the region where the second film 143 in FIG. 4 is formed. That is, the position measuring pattern 147 is also formed in the pattern forming region 145.

As described above, the pattern to be inspected 144 is formed in order to assist the transfer of the pattern to the wafer or the transfer of the fine pattern to the wafer. On the other hand, the position measuring pattern 147 is used to obtain coordinates of a predetermined position on the mask 101, but not used to transfer the pattern to the wafer. However, because the position measuring pattern 147 is also formed by selectively removing the first film 142, light transmitted through the pattern to be inspected 144 is also transmitted through the position measuring pattern 147. For this reason, in order that the position measuring pattern is not substantially transferred to the wafer, a size of the position measuring pattern 147 is designed smaller than a predetermined value such that intensity of the light transmitted through the position measuring pattern 147 is weakened.

For example, as illustrated in FIGS. 2 to 5, for the position measuring pattern 147 formed into a cross shape constructed with the line patterns orthogonal to each other, a size in a width direction of the line pattern constituting the cross shape is less than 160 nm when a wavelength of exposure light is set to 193 nm in transferring the pattern to be inspected 144 to the wafer, and the position measuring pattern 147 is not substantially transferred to the wafer when the first film 142 is the halftone film having the transmittance lower than that of the substrate 141.

It is also effective that the contrast of the position measuring pattern transferred to the wafer is expected from a shape of the position measuring pattern and a shape of the light with which the position measuring pattern is illuminated, thereby a dark portion is formed at a pattern position corresponding to a bright portion while the opening is formed at a pattern position corresponding to the dark portion. As used herein, the bright portion means a portion that is larger than a predetermined gradation value, and the dark portion means a portion that is less than or equal to the predetermined gradation value. According to this method, the contrast of the transferred pattern on the wafer is lowered because of an optical interference effect, so that the position measuring pattern can barely be transferred to the wafer.

Figure 5:
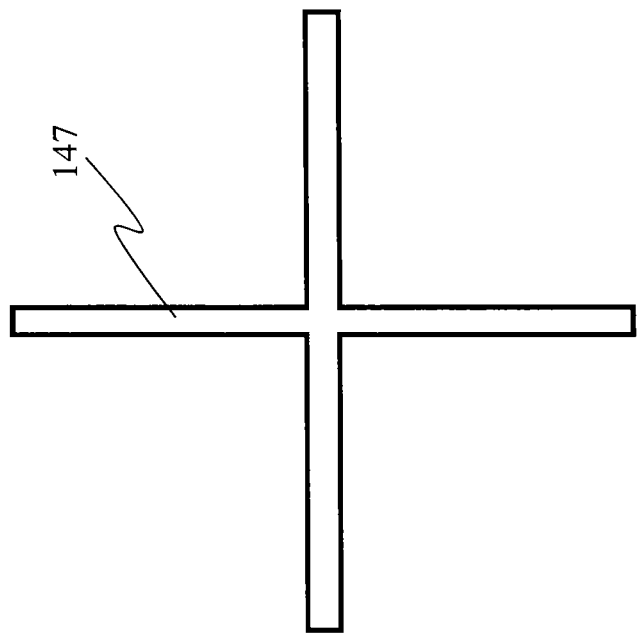
FIG. 5 is one example of a position measuring pattern.
Figure 6:
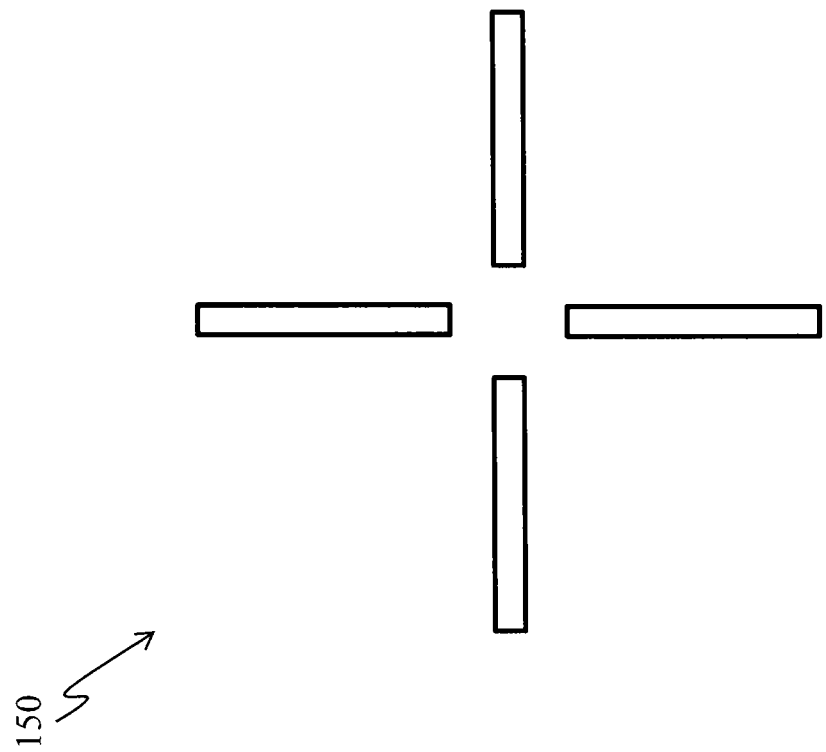
FIG. 6 is another example of a position measuring pattern.
Figure 7:
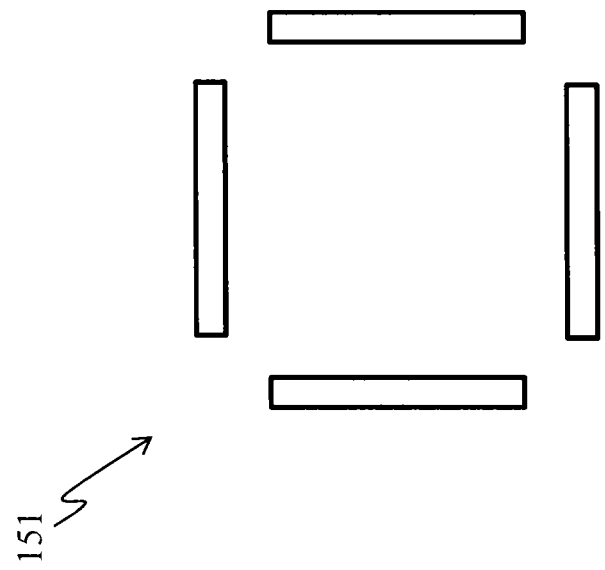
FIG. 7 is another example of a position measuring pattern.

For example, the center and surrounding region of the transfer pattern is brightened when the position measuring pattern has the cross shape as illustrated in FIG. 5. Therefore, as illustrated in FIG. 6, for a pattern 150 in which center and surrounding region is darkened, the contrast of the transfer pattern on the wafer can be lowered. As illustrated in FIG. 7, there may also be formed a pattern 151 in which rectangular openings are arranged into a frame shape while an inside of the frame shape is darkened. In this case, the similar effect is obtained.

The inspection system used to obtain the optical image in S2 of the position measuring method of the first embodiment will be described below.

Figure 8:
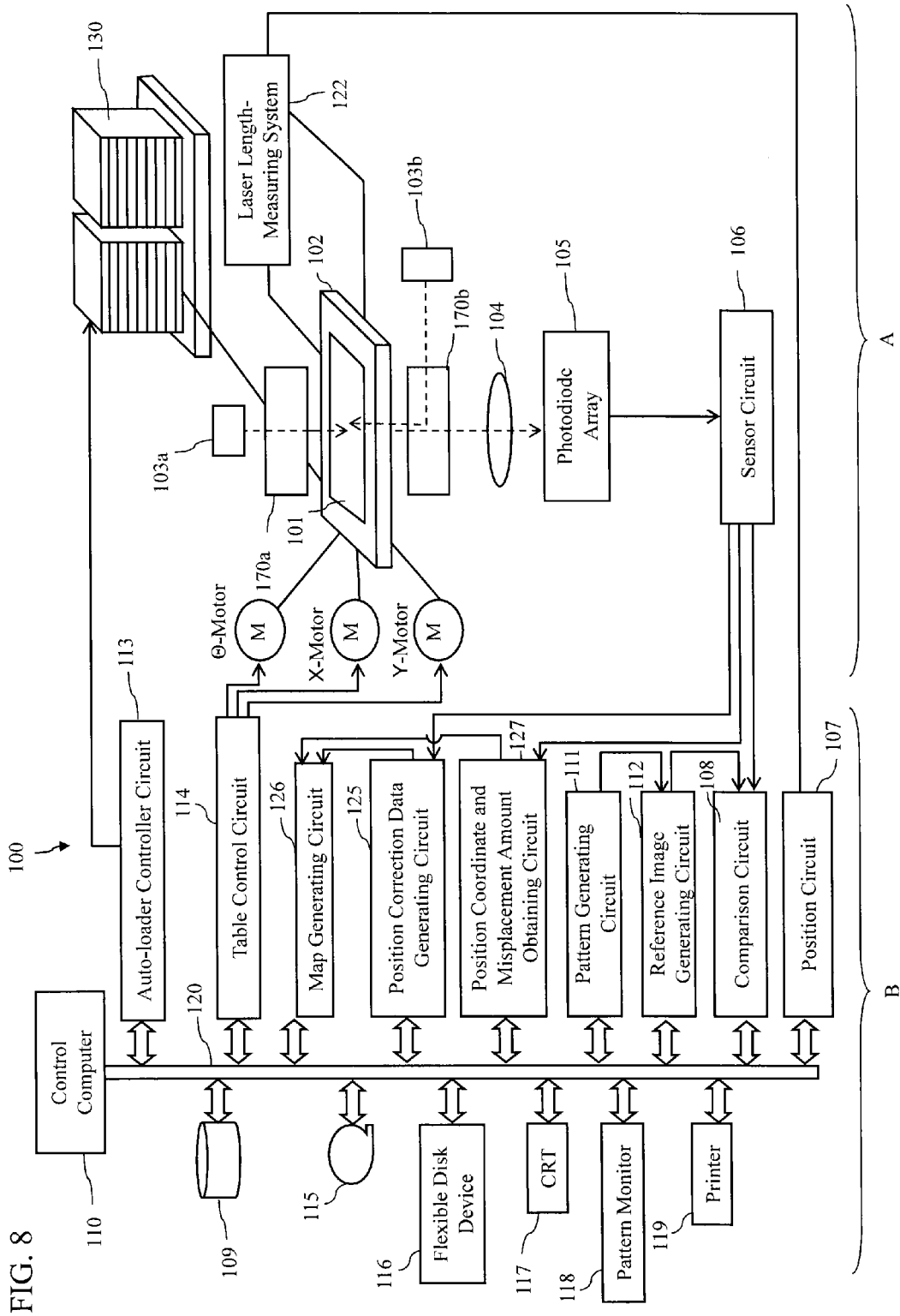
FIG. 8 is a schematic configuration diagram of the inspection system according to the first embodiment.
Figure 9:
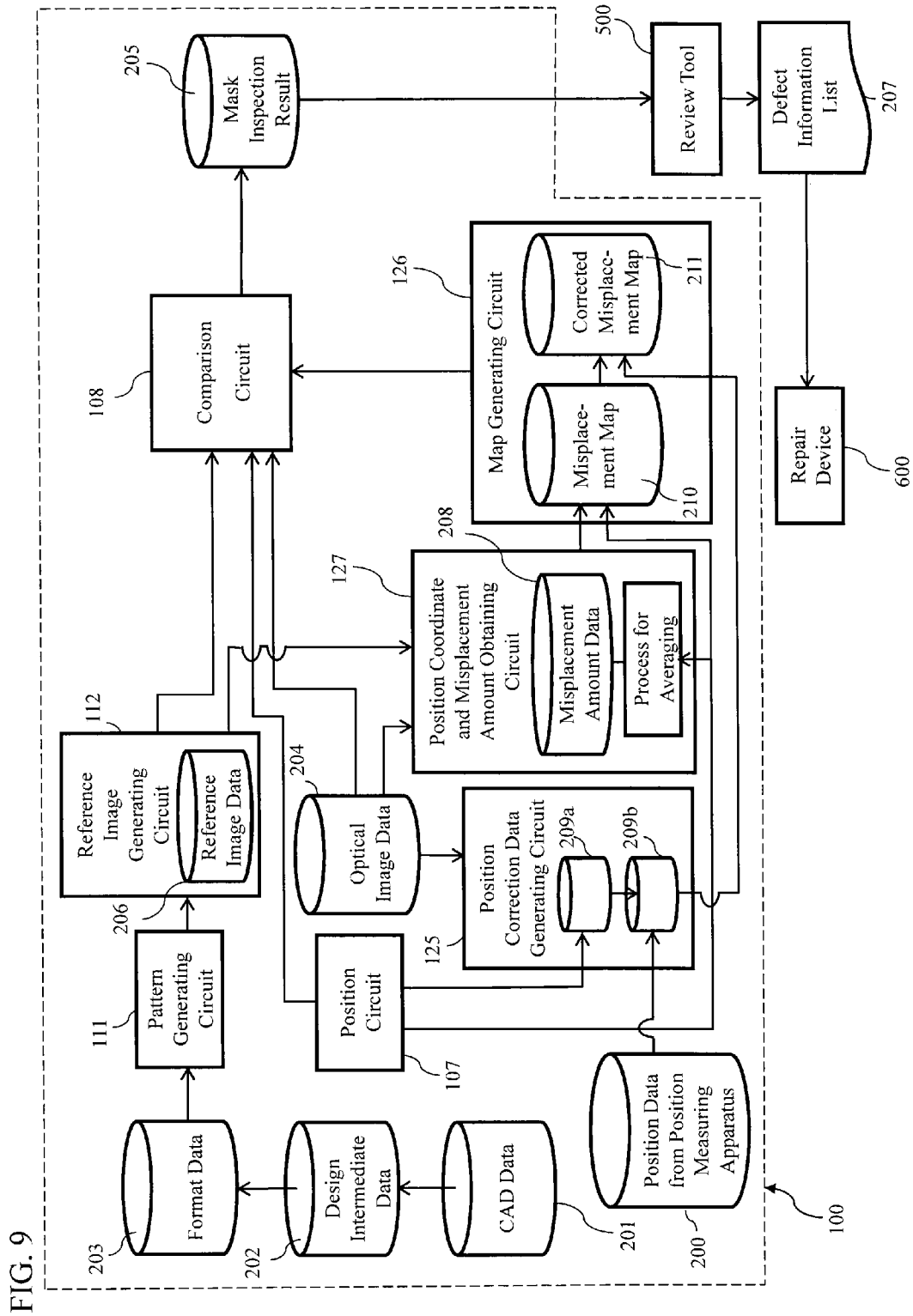
FIG. 9 is a view illustrating a data flow in the inspection system of FIG. 8.

FIG. 8 is a schematic configuration diagram of the inspection system 100, which is used S2. FIG. 9 is a view illustrating a data flow in the inspection system 100 as shown in FIG. 8. In FIGS. 8 and 9, a configuration unit necessary in the present embodiment is illustrated. However, another well-known configuration unit necessary for an inspection may be used. As used herein, a "unit" or "circuit" can be configured by a program operating on a computer. Alternatively, the "unit" or "circuit" may be constructed by not only the program that is software, but also a combination of software, hardware, or firmware. In the case that the "unit" or "circuit" may be constructed by the program, the program can be stored in a storage unit such as a magnetic disk device.

As illustrated in FIG. 8, an inspection system 100 includes a configuration unit A that constitutes an optical image acquiring unit, and a configuration unit B that performs processing necessary for an inspection using an optical image obtained by the configuration unit A, and performs generation of a misplacement map.

The configuration unit A includes a light source 103, an XYθ-table 102 that is movable in a horizontal direction (X-direction and Y-direction) and a rotation direction (θ-direction), light sources 103a, 103b, a transmission illumination optical system 170a, a reflection illumination optical system 170b, a magnifying optical system 104, a photodiode array 105, a sensor circuit 106, a laser length-measuring system 122, and an auto-loader 130. A sensor (not illustrated) is disposed in the photodiode array 105. A TDI (Time Delay Integration) sensor can be cited as an example of the sensor.

The laser length-measuring system 122 constitutes a position measuring unit to measure the position of the XYθ-table 102. Although not illustrated, for example, a laser beam emitted from a laser head is incident on and reflected from a stage mirror fixed to the XYθ-table 102 to measure the position of the XYθ-table 102.

In the configuration unit A, the optical image data 204 of the mask 101 that becomes an inspection target is obtained. The optical image data 204 is image data of a mask in which a geometrical pattern is written based on graphic data (geometrical data) included in design pattern data of the mask 101. For example, the optical image data 204 is 8-bit data with no code, and expresses a gradation of brightness of each pixel.

In the configuration unit B, the control computer 110, that is, the controller controlling the whole of the inspection system 100 is connected to a position circuit 107; a pattern generating circuit 111; a reference image generating circuit 112 that constitutes a reference image generating unit; a comparison circuit 108 that constitutes a comparison unit; a position correction data generating circuit 125 that constitutes a position correction data generating unit configured to generate data for correcting a position; a map generating circuit 126 that constitutes a map generating unit; a position coordinate and misplacement amount obtaining circuit 127 that constitutes a position coordinate and misplacement amount obtaining unit configured to obtain a position coordinate and a misplacement amount; an auto-loader control circuit 113; a table control circuit 114; a magnetic disk device 109, a magnetic tape device 115, a flexible disk device 116, as examples of a memory unit; a CRT (cathode ray tube) 117; a pattern monitor 118; and a printer 119, through a bus 120 that constitutes a data transmission line. The XYθ-table 102 is driven by an X-axis motor, a Y-axis motor, and a θ-axis motor under the control of the table control circuit 114. For example, an air slider, a linear motor, and a step motor can be used as these driving mechanisms and can further be used in any combination with each other.

The control computer 110 controls the table control circuit 114 to drive the XYθ-table 102. A position coordinate (x, y) of the XYθ-table 102 is measured by the laser length-measuring system 122 mentioned above, and transmitted to the position circuit 107.

The control computer 110 controls the auto-loader control circuit 113 to drive the auto-loader 130. The auto-loader 130 automatically conveys the mask 101, and automatically discharges the mask 101 after the inspection period.

In the position measuring method of the first embodiment, the position of the pattern to be inspected formed in the mask is measured using the above inspection system. The processes (S1 to S7) in FIG. 1 of the position measuring method of the first embodiment will be described in detail below.

S1 is performed on the pattern to be inspected that is an original position measurement target in order to generate correction data used to obtain the correct coordinate position. In S1, the position coordinate of the position measuring pattern of the mask 101 is measured using the position measuring apparatus.

The position measuring apparatus is an external apparatus of the inspection system, and the position measuring apparatus inspects the pattern to be inspected of the mask 101. For example, LMS-IPRO (a product of LEICA) is used as the position measuring apparatus.

In S1, the position coordinates of all the position measuring patterns arranged in the mask 101 are not necessarily measured. As described later with reference to FIG. 10, the optical image of the position measuring pattern is acquired in each stripe that virtually divides the region in which the pattern is arranged, and the position coordinates of the position measuring patterns located at starting and ending points of each stripe are measured in each stripe. Alternatively, the position coordinate of the position measuring pattern located at one of the starting and ending points of each stripe may be measured in each stripe.

In FIG. 2, strip-shaped stripes (not illustrated in FIG. 2) in which an X-axis direction is set to a longitudinal direction are arranged along a Y-axis direction in the mask 101. The region indicated by a symbol S corresponds to the starting point of each stripe, and the region indicated by a symbol E corresponds to the ending point of each stripe. The position coordinate of the position measuring pattern arranged in at least one of the region indicated by the symbol S and the region indicated by the symbol E is measured in S1 of FIG. 1.

S2 is performed in the same fashion as the above-mentioned S1, that is, on the pattern to be inspected that is the original position measurement target in order to generate the correction data used to obtain the correct coordinate position.

S2 is performed as follows, using the inspection system 100 in FIG. 8.

Firstly, the mask 101 is positioned on the XYθ-table 102. Next, while the optical image of the position measuring pattern is acquired, a position coordinate (x, y) of the XYθ-table 102 corresponding to the optical image is measured with the laser length-measuring system 122. Thereby, the position coordinate (x, y) of the position measuring pattern is obtained.

As described above, the position measuring pattern is designed to be prevented from being substantially transferred to the wafer along with the pattern to be inspected to be inspected by illumination of the transmitted light. For this reason, the clear optical image of the position measuring pattern necessary for the position measurement is not obtained using the illumination of the transmitted light. Therefore, referring to FIG. 8, the mask 101 is irradiated with the light emitted from the light source 103b provided below the XYθ-table 102 through the reflection illumination optical system 170b, and the reflected light is incident on the photodiode array 105 through magnifying optical system 104.

The photodiode array 105 performs photoelectric conversion on the light incident on the photodiode array 105, and the sensor circuit 106 performs A/D (analog-to-digital) conversion. Thereby, optical image data 204 of the position measuring pattern is acquired.

Figure 10:
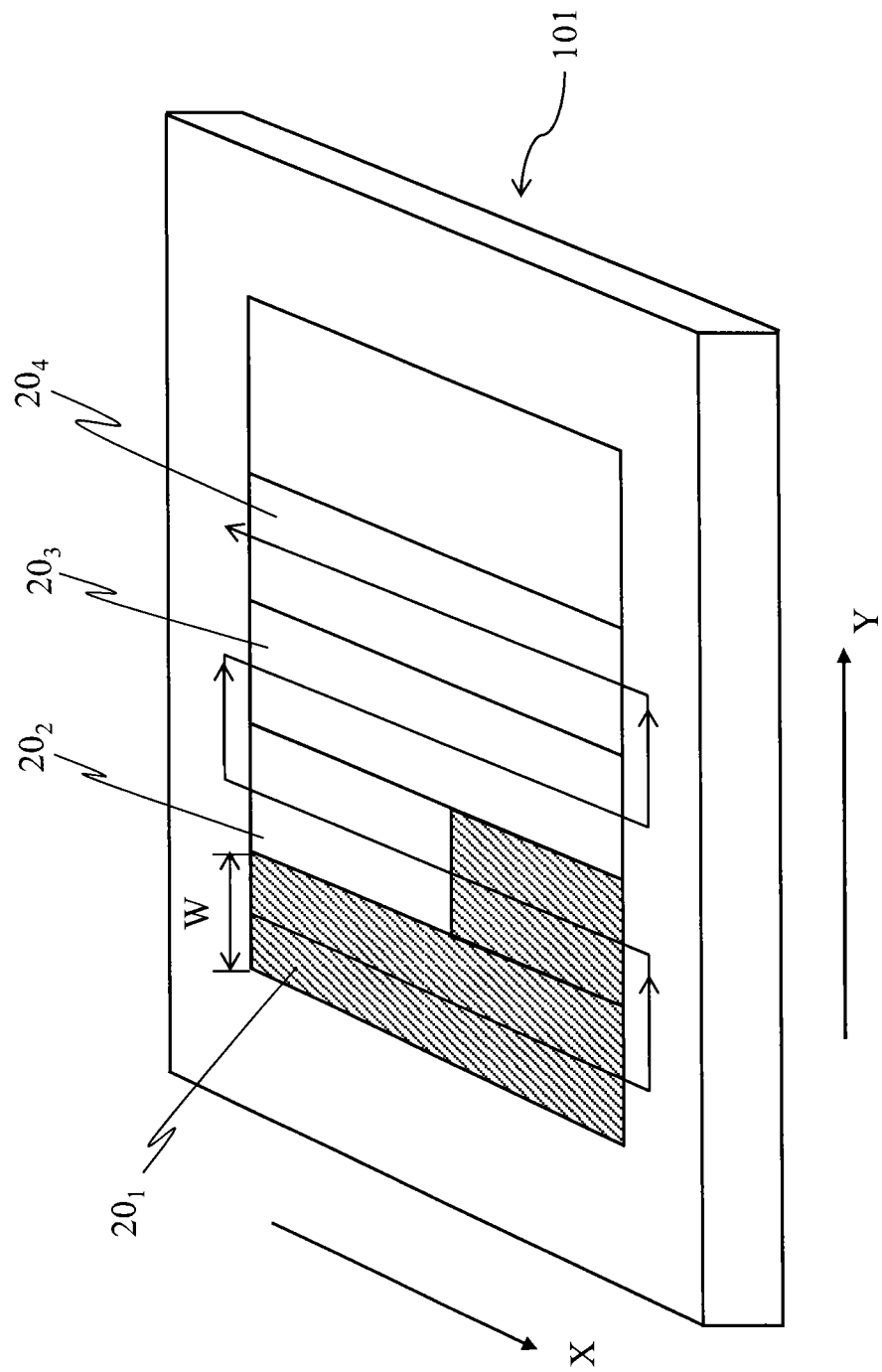
FIG. 10 is a view illustrating a procedure for acquiring the optical image of the pattern arranged in the mask.

FIG. 10 is a view illustrating a procedure for acquiring the optical image of the position measuring pattern formed in the mask 101. In FIG. 10, the mask 101 is positioned on the XYθ-table 102 in FIG. 8. Because the region where the position measuring pattern is arranged partially overlaps the region where the pattern to be inspected is arranged, the optical image of the pattern to be inspected is acquired in the same fashion as the optical image of the position measuring pattern.

As shown in FIG. 10, the position measuring pattern is arranged in the pattern forming region in which the pattern to be inspected is formed, and in the region surrounding the pattern forming region. The region in which the pattern to be inspected and the position measuring pattern are formed, is virtually divided into the strip-shaped multiple inspection regions, namely, stripes $20_1$, $20_2$, $20_3$, $20_4$, . . . as illustrated in FIG. 10. For example, each stripe is a region having the width of several hundred micrometers and the length of about 100 mm corresponding to the total length in the X-direction or Y-direction of the mask 101.

Every stripe of the optical image of the position measuring pattern is acquired by illuminating light from the light source 103, wherein the light source is a pulse laser having a wavelength of 199 nm, to the mask 101, and continuously moving the XYθ table 102 at the movement speed of 10 mm per second, thereby light reflected by the mask 101 is incident to the photodiode array 105. That is, while acquiring the optical image of the position measuring pattern, as shown in FIG. 10, the operation of the XYθ-table 102 is controlled such that the each stripe $20_1, 20_2, 20_3, 20_4, \ldots$ is continuously scanned. Specifically, the optical image of the position measuring pattern is acquired while the XYθ-table 102 moved in the −X-direction of FIG. 10. The image having a scan width W in FIG. 10 is continuously input to the photodiode array 105 in FIG. 8. An arrow in FIG. 10 indicates the optical image acquiring direction and sequence, and a hatched portion indicates the region where the optical image has already been obtained.

In FIGS. 8 and 9, the optical image data 204 of the position measuring pattern is sent from the sensor circuit 106 to the position correction data generating circuit 125. The measurement value of the position coordinate of the XYθ-table 102 measured with the laser length-measuring system 122 is sent to the position circuit 107. Then, the measurement value of the position coordinate of the XYθ-table 102 is read by the control computer 110, and sent to the position correction data generating circuit 125.

The position correction data generating circuit 125 obtains the position coordinate of the position measuring pattern based on the optical image data 204 from the sensor circuit 106 and the measurement value of the position coordinate of the XYθ-table 102 from the position circuit 107.

For example, in the case where the position measuring pattern is the cross pattern, an edge of the line extending in the X-direction and an edge of the line extending in the Y-direction are detected in the optical image data 204. The position coordinate of each detected edge is obtained from the position coordinate of the XYθ-table 102 measured with the laser length-measuring system 122.

In S3, for example, the plural position coordinates are interpolated using the plural measurement values of the position coordinates of the plural position measuring patterns (obtained in S2), and the plural measurement values of position coordinates are associated to generate the first position correction data 209a.

That is, the first position correction data 209a is data in which X-coordinate positions and Y-coordinate positions of the plural position measuring patterns is plotted on an XY-coordinate plane. Specifically, the plots of the plural position coordinates on the XY-coordinate plane are interpolated, for example, a linear graph is obtained as a graph connecting the interpolated plots. In this case, the obtained linear graph on the XY-coordinate plane approximates a relationship between the X-coordinate position and Y-coordinate position of the position measuring pattern. The linear relationship between the X-coordinate position and Y-coordinate position of the position measuring pattern is extracted from the graph as a primary expression such as Y=mX+n (m is a gradient of the graph and n is a Y-intercept of the graph), whereby the plural measurement value of the position coordinates of the plural position measuring patterns are associated to obtain the first position correction data 209a. In this case, the interpolation of the position coordinate of the position measuring pattern and the association between the X-coordinate position and Y-coordinate position of the position measuring pattern can be performed by a least square method.

As described later, using the measurement value of a position coordinate of the position measuring pattern measured with the position measuring apparatus in S1, the obtained first position correction data 209a is corrected to obtain second position correction data 209b. The second position correction data 209b is used to correct the position coordinate of the pattern to be inspected that is obtained during the inspection by the inspection system 100.

The first position correction data 209a may be a map in which the misplacement amount between the measurement value of a position coordinate of the position measuring pattern and the design coordinate of the position measuring pattern is calculated and plotted on the XY-coordinate plane with respect to the position in the X-direction in each stripe of FIG. 10. In this case, the misplacement amount is a vector amount indicating a degree and a direction of the misplacement amount.

In the first embodiment, the first position correction data 209a is generated by the position correction data generating circuit 125.

Because the number of position measuring patterns arranged in the mask 101 is usually in the several tens (for example, 30), the first position correction data 209a, for example, is generated by interpolating the measurement value of the position coordinate of several tens of position measuring patterns or the above-mentioned misplacement amount. Examples of the interpolation method include known methods such as, linear interpolation, interpolation in which a polynomial is used, and spline interpolation. The position coordinate or misplacement amount of the position measuring pattern arranged near the pattern to be inspected can be obtained by the interpolation, so that correcting accuracy of the position coordinate of the pattern to be inspected can be improved.

Generally, in the laser length-measuring system, sometimes a refractive index changes to generate a measurement error when a temperature difference or a density difference is generated by a fluctuation of air in an optical path of the laser beam. Therefore, it is preferable that the position coordinate of the position measuring pattern is measured a plurality of times to average an influence of the fluctuation of air. In the inspection system 100 shown in FIG. 8, the process of acquiring the optical image of the position measuring pattern is performed a plurality of times while the position coordinate of the XYθ-table 102 is measured with the laser length-measuring system 122, and an average value of the X-coordinates and an average value of the Y-coordinates of the XYθ-table 102 corresponding to the optical image are obtained. Preferably, the first position correction data 209a is generated with the obtained average coordinate as the position coordinate of the position measuring pattern. The measurement value of the position coordinate of the XYθ-table 102 measured with the laser length-measuring system 122 is sent to the position circuit 107, and then is read by the control computer 110, and then is sent to the position correction data generating circuit 125. Therefore, the average coordinate may be calculated by either the position correction data generating circuit 125 or the control computer 110.

In S4, the first position correction data (obtained in S3) is corrected to generate the second position correction data.

As described above, the first position correction data 209a is obtained using the optical image data 204 of the position measuring pattern. In this case, because the optical image data 204 is obtained by the inspection system 100, it is necessary to consider and correct the fluctuation caused by inspection system 100 in order to more accurately obtain the position correction data. Therefore, the second position correction data is generated from the first position correction data 209a.

Using the measurement value of a position coordinate of the position measuring pattern obtained by the position measuring apparatus in S1 of FIG. 1, the first position correction data 209a is corrected to generate the second position correction data 209b (S4).

Similarly to the first position correction data 209a, the second position correction data 209b is generated by the position correction data generating circuit 125.

For example, the position data (indicated by the symbol 200 in FIG. 9) obtained in S1 by the position measuring apparatus, namely, the measurement value of a position coordinate of the position measuring pattern is stored in, for example, the magnetic disk device 109 of FIG. 8. The control computer 110 reads the measurement value of a position coordinate from the magnetic disk device 109, and sends the measurement value of a position coordinate to the position correction data generating circuit 125. The position correction data generating circuit 125 corrects the first position correction data 209a using the sent measurement value of a position coordinate of the position measuring pattern. The first position correction data 209a is corrected as follows.

For example, the measurement value of the position coordinate of the position measuring pattern measured by the position measuring apparatus becomes the measurement value of the position coordinate of the position measuring pattern located at each of the starting and ending points in each stripe of FIG. 10. On the other hand, the first position correction data, is data wherein X-coordinate positions and Y-coordinate positions are plotted with respect to a plurality of position measuring patterns using the inspection system 100 mentioned above. Accordingly, in the first position correction data 209a, the position coordinate of the position measuring pattern, which is measured with the position measuring apparatus and used in the correction, does not exist with respect to the position coordinates of the position measuring patterns located at the positions except for the starting and ending points. Therefore, a difference between the position coordinates at the starting and ending points of the first position correction data 209a and the position coordinates at the identical starting and ending points measured with the position measuring apparatus is obtained (while a plot tendency in the first position correction data 209a is maintained), and estimation is performed based on the obtained difference to correct the first position correction data 209a that is the plots of the plural measurement values.

In S5, the optical image of the pattern to be inspected and the optical image of the position measuring pattern are acquired while the position coordinate of the XYθ-table 102 is measured using the inspection system 100. The process in S5 is performed during inspection of the defect of the pattern to be inspected.

A procedure for acquiring the optical image of the pattern to be inspected is similar to that in FIG. 10, and the optical image of the position measuring pattern is acquired together with the pattern to be inspected. In this case, the optical image of the pattern to be inspected can be acquired using either the transmitted light or the reflected light. Because the optical image acquired by the reflected light is frequently used in inspecting the pattern to be inspected, it is desirable that the reflected light is also used to obtain the optical image of the position measuring pattern. Thereby, the optical image of the position measuring pattern and the optical image of the inspected pattern can both be obtained concurrently using the reflected light.

As described above, the photodiode array 105 performs photoelectric conversion on the light incident on the photodiode array 105, and the sensor circuit 106 performs A/D (analog-to-digital) conversion. The optical image data 204 from the sensor circuit 106 is sent to the position coordinate and misplacement amount obtaining circuit 127. The optical image data 204 includes the data of the position measuring pattern and the data of the pattern to be inspected.

While the optical image data 204 is acquired, the laser length-measuring system 122 measures the position coordinate of the XYθ-table 102 corresponding to the optical image data 204. The measurement value of a position coordinate of the XYθ-table 102 is sent to the position circuit 107, and then is read by the control computer 110, and then is sent to the position coordinate and misplacement amount obtaining circuit 127.

In S6, the position coordinate of the pattern to be inspected and the position coordinate of the position measuring pattern are obtained from the measurement value of a position coordinate of the XYθ-table 102 (obtained in S5) and the optical image. The process in S6 is performed by the position coordinate and misplacement amount obtaining circuit 127.

The position coordinate and misplacement amount obtaining circuit 127 obtains the position coordinate of the pattern to be inspected and the position coordinate of the position measuring pattern from the optical image data 204 and the measurement value of a position coordinate of the XYθ-table 102 obtained during the inspection. Specifically, the optical image data obtained in units of stripes is divided into small regions called blocks (or frames). A predetermined region of the optical image is compared with a reference image generated from design data corresponding to the predetermined region, and the XYθ-table 102 is shifted parallel to the position where an absolute value of a difference value of the images or a square sum of a difference is minimized by pattern matching. The position coordinate of the pattern to be inspected is determined from the parallel shift amount, and from data recorded by laser length-measuring system 122 of the block.

In S7, the position coordinate of the pattern to be inspected obtained in S6 is corrected using the second position correction data. The measurement value of the position coordinate of the pattern to be inspected obtained in the above-mentioned S6 includes an error caused by an environmental fluctuation in the inspection system, therefore the correction of the measurement value using the second position correction data is necessary.

For example, because a design positional relationship between the pattern to be inspected and position measuring pattern in the mask 101 is previously known, the misplacement amount of the pattern to be inspected is obtained from the measurement value of the position coordinate of the positioning measuring pattern (obtained in S6), and the misplacement amount of the position coordinate of the position measuring pattern according to the second position correction data based on the above-mentioned design positional relationship. This misplacement amount is a true value of the misplacement amount between the position coordinate of the pattern to be inspected and the design coordinate, that is, a misplacement value in which the measurement error caused by a temperature fluctuation in the inspection system is minimized. The measurement value of a position coordinate of the pattern to be inspected is corrected when the true value of the misplacement amount is obtained. Thereby, the accurate position coordinate of the pattern to be inspected can be obtained. The individual pattern to be inspected is corrected by referring to the position of the position measuring pattern located near the pattern to be inspected and obtained from the second position correction data 209b.

Figure 11:
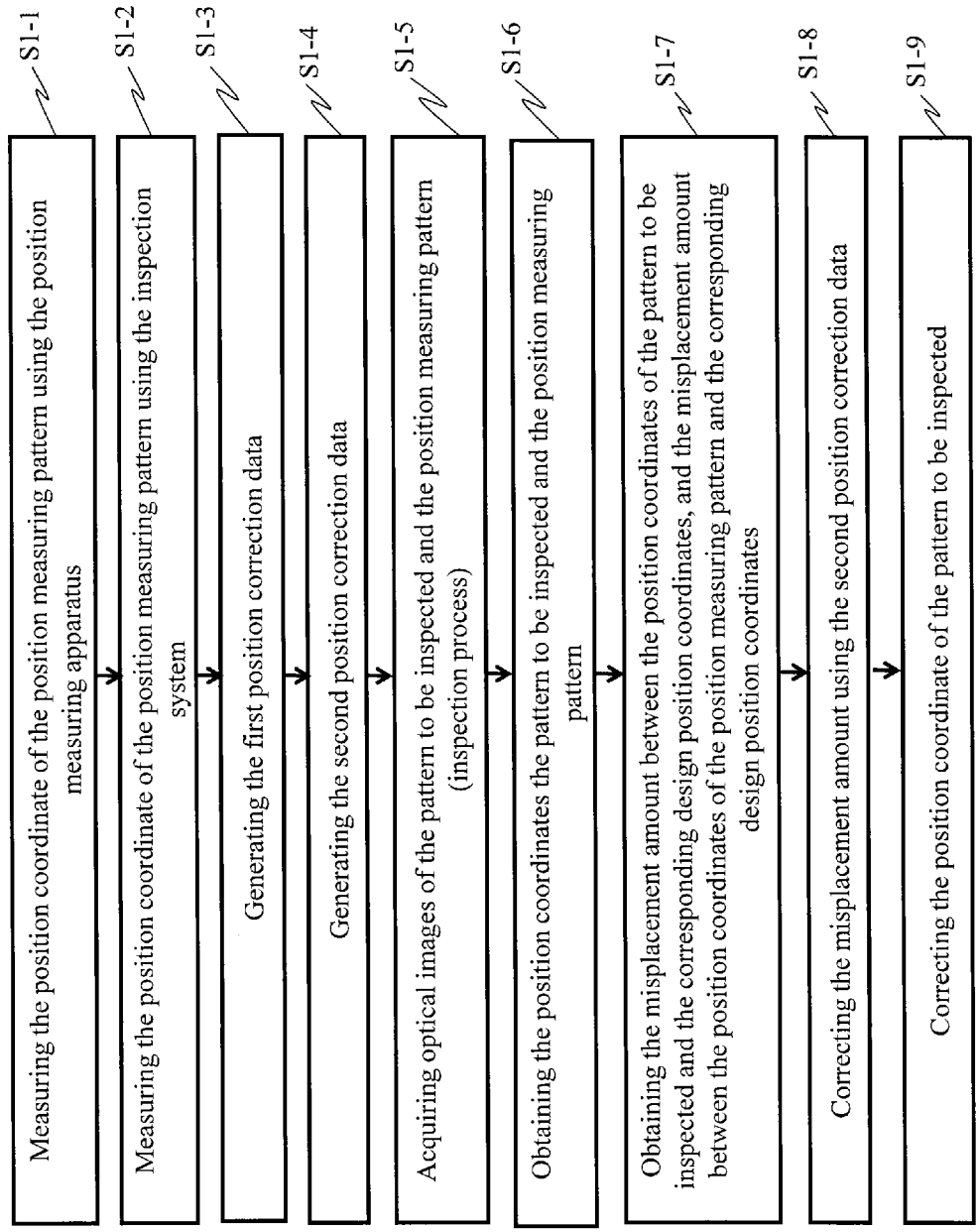
FIG. 11 is another example of a flowchart of the position measuring method according to the first embodiment.

The accurate position coordinate of the pattern to be inspected can be obtained using the first position correction data as shown in FIG. 11. The first position correction data 209a is a map obtained by calculating the misplacement amount between the measurement value of the position coordinate of the position measuring pattern and the design position coordinate of the position measuring pattern, and plotting along the X-direction for each stripe shown in FIG. 10.

Because the processes in S1-1 to S1-6 of FIG. 11 are identical to the processes in S1 to S6 of FIG. 1, respectively, the detailed description is omitted.

Firstly, as illustrated in FIG. 11, the position measuring apparatus measures the position coordinate of the position measuring pattern (S1-1). Further, the inspection system measures the position coordinate of the position measuring pattern (S1-2).

Next, the misplacement amount from the design coordinate is obtained with respect to the measurement values of each position coordinate of a plurality of position measuring patterns (obtained in S1-2). Then the obtained misplacement amounts are plotted with respect to the position along the X-direction in each stripe as shown in FIG. 10. Further, the first position correction data 209a is generated by interpolating the values of the misplacement amounts (S1-3).

Next, using the position coordinate of the position measuring pattern measured with the position measuring apparatus (obtained S1-1), the first position correction data 209a is corrected to generate the second position correction data 209b (S1-4).

Each optical image of the pattern to be inspected and position measuring pattern are acquired (S1-5), and each position coordinate of the pattern to be inspected and position measuring pattern are acquired (S1-6).

Next, the misplacement amount between the measurement value of the position coordinate of the pattern to be inspected (obtained in S1-6), and the corresponding design position coordinate is obtained (S1-7). Another misplacement amount between the measurement value of the position coordinate of the position measuring pattern (obtained in S1-6) and the corresponding design position coordinate is obtained (S1-7). These amounts are plotted with respect to the position in the X-direction in each stripe of FIG. 10. The process in S1-7 is performed by the position coordinate and misplacement amount obtaining circuit 127 in FIG. 9.

Next, the misplacement amount (obtained in S1-7) is corrected using the second position correction data 209b (S1-8). The process in S1-8 is performed by the map generating circuit 126 as shown in FIG. 9. For example, a difference between the misplacement amount obtained from the measurement value of the position coordinate and the second position correction data 209b is obtained with respect to each position measuring pattern, and is added to or subtracted from the misplacement amount obtained from measurement value of a position coordinate of the pattern to be inspected. Thereby, the accurate misplacement amount of the pattern to be inspected is obtained. In this case, it is preferable that the difference applied to the misplacement amount of the pattern to be inspected is obtained from the position measuring pattern located as close to the pattern to be inspected as possible. As described above, because the number of position measuring patterns arranged in the mask 101 is restricted, the difference of the position measuring pattern near the pattern to be inspected can be estimated and applied to the pattern to be inspected by interpolating the misplacement amounts obtained from the measurement value of the position coordinate of the position measuring pattern.

In S1-8, the accurate misplacement amount between the position coordinate and the design position coordinate is obtained with respect to the pattern to be inspected. This misplacement amount is the true value of the misplacement amount between the position coordinate and the design coordinate with respect to the pattern to be inspected, namely the value which minimizes the measurement error caused by the temperature fluctuation in the inspection system 100.

In S1-9, the position coordinate of the pattern to be inspected is corrected using the true value of the misplacement amount obtained in S1-8. Thereby, the accurate position of the pattern to be inspected can be obtained.

For example, a risk of missing a defect that should be detected as the defect can be reduced when the accurate position of the pattern to be inspected is obtained. Additionally, a defect that should not be detected as the defect can be prevented.

In the first embodiment, in order to obtain the accurate position coordinate of the pattern to be inspected, it is necessary to generate the accurate second position correction data 209b. Therefore, it is necessary to increase the number of position measuring patterns to increase the number of measurement points constituting the second position correction data 209b and therefore to the first position correction data 209a. In the first embodiment, as illustrated in FIG. 2, the position measuring pattern 147 is also formed in the pattern forming region 145. That is, the total number of position measuring patterns 147 can be increased because the position measuring pattern 147 can be formed in the pattern forming region 145, compared with the case that the position measuring pattern 147 is formed in a region excluding the pattern forming region 145. In this case, the size of the position measuring pattern 147 is reduced smaller than a predetermined value, and the intensity of the light transmitted through the position measuring pattern 147 is suppressed, which allows the position measuring pattern 147 to avoid being substantially transferred to the wafer. The contrast of the transfer pattern transferred to the wafer is estimated from the shape of the pattern and the shape of the light with which the pattern is illuminated, so that the dark portion is formed at the pattern position corresponding to the bright portion, and the opening is formed at the pattern position corresponding to the dark position, accordingly the contrast of the transfer pattern is lowered, also allowing the position measuring pattern 147 to be similarly avoided from being substantially transferred to the wafer.

The design position coordinates of the pattern to be inspected and position measuring pattern are obtained from the reference image generated from the design data of the pattern to be inspected and position measuring pattern. The reference image is generated in the inspection system 100 of FIG. 8 from the design data of the pattern to be an inspection target pattern, described as follows.

As illustrated in FIG. 9, CAD data 201 created by a designer (user) is converted into design intermediate data 202 having a hierarchical format such as OASIS. The pattern data (design pattern data), which is generated in each layer and formed in the mask 101, is stored in the design intermediate data 202.

That is, the pattern data is stored in the magnetic disk device 109 of the inspection system 100 as shown in FIG. 8. In a geometrical pattern included in the pattern data, a rectangle or a triangle is used as a basic geometrical pattern. For example, Graphic data (geometrical data) in which the shape, size, and position of each geometrical pattern is stored in the magnetic disk device 109. For example, the graphic data (geometrical data) is information such as a coordinate (x, y) at a reference position of the geometrical pattern, a side length, and a graphic code (geometrical code) that becomes an identifier identifying a geometrical pattern type such as a rectangle and a triangle.

The design intermediate data 202 is converted into format data 203 having a format that can be read by an electron beam lithography apparatus. Thereby, the inspection system 100 can directly read the pattern writing data of the electron beam lithography apparatus.

The pattern generating circuit 111 reads the input pattern data from the magnetic disk device 109 through the control computer 110. Next, in the pattern generating circuit 111, the pattern data is converted into binary or other multiple bit image data (design image data). Specifically, the pattern generating circuit 111 expands the pattern writing data to individual data of each geometrical pattern, and interprets the geometrical pattern code and geometrical pattern dimension, which indicate the geometrical pattern shape of the geometrical pattern data. The pattern data is expanded into binary or other multiple bit image data as the pattern disposed in a square having a unit of a grid of a predetermined quantization dimension. Then an occupancy rate of the geometrical pattern in the design pattern is calculated in each region (square) corresponding to a sensor pixel, and the occupancy rate of the geometrical pattern in each pixel becomes a pixel value.

The image data converted by the pattern generating circuit 111 is transmitted to the reference image generating circuit 112.

The reference image generating circuit 112 generates the reference image data 206 by performing an appropriate filtering process to the pattern data, which is image data of the graphic. The reason why this filtering process is performed is as follows.

In the production process, because roundness of the corner, and a finished dimension of the line width are adjusted, the pattern formed in the mask 101 is not strictly matched with the design pattern. The optical image obtained by the sensor circuit 106 as shown in FIG. 8 is faint due to a resolution characteristic of the magnifying optical system 104, or an aperture effect of the photodiode array 105, in other words, the state in which a spatial low pass filter functions. Therefore, the mask that becomes the inspection target is observed in advance of the inspection, a filter coefficient imitating the production process or a change of an optical system of the inspection apparatus is determined to subject the pattern data to a two-dimensional digital filter. Thus, the processing of imitating the optical image is performed to the reference image.

A learning process of the filter coefficient may be performed using the pattern of the mask that becomes the reference determined in the mask production process, or a part of the pattern of the mask (mask 101 in the present embodiment) that becomes the inspection target. In the latter case, the filter coefficient is obtained in consideration of the pattern line width and a finished degree of the roundness of the corner of the region used in the learning process, and is used for a defect determination criterion of the whole mask.

It is advantageous in the case that the mask 101 that becomes the inspection target is used, as the learning process of the filter coefficient can be performed without removing influences such as a production variation and a fluctuation in the condition of the inspection apparatus. However, when the dimension fluctuates in the surface of the mask 101, the filter coefficient becomes optimum with respect to the position used in the learning process, but the filter coefficient does not necessarily become optimum with respect to other positions, which results in a pseudo defect. Therefore, preferably the learning process is performed around the center of the surface of the mask 101 that is hardly influenced by the fluctuation in dimension. Alternatively, the learning process is performed at multiple positions in the surface of the mask 101, and the average value of the obtained multiple filter coefficients may be used.

As described above, the difference of the measurement value is generated by the environmental fluctuation in the inspection system even if the identical position of the pattern is measured by the identical method. In the position measuring method according to the first embodiment, the accurate position of the pattern can be obtained by correcting the fluctuation of the measurement value.

Particularly, in the first embodiment, the position measuring pattern is also formed in the region where the pattern to be inspected is formed in the mask, so that the accurate position correction data can be accurately obtained while the total number of position measuring patterns is increased. In this case, the size of the position measuring pattern is reduced smaller than the predetermined value, and the intensity of the light transmitted through the position measuring pattern is suppressed, which allows the position measuring pattern to be avoided from being substantially transferred to the wafer. The contrast of the transfer pattern transferred to the wafer is predicted from the shape of the pattern and the shape of the light with which the pattern is illuminated, so that the dark portion is formed at the pattern position corresponding to the bright portion, and the opening is formed at the pattern position corresponding to the dark position, accordingly the contrast of the transfer pattern is lowered, also allowing the position measuring pattern to be similarly avoided from being substantially transferred to the wafer.

Further, according to the position measuring method of the present embodiment, the inspection can be accurately performed by accurately obtaining the position of the pattern to be inspected. That is, the inspection is performed without considering the fluctuation of the measurement value of a position coordinate of the pattern to be inspected, possibly the misplacement amount that should not originally be permitted is permitted and the permissive misplacement amount is detected as the defect. However, when the inspection is performed after the position coordinate of the pattern to be inspected is corrected, the defect that can hardly be detected can be detected, or the detection of the defect that should not be detected as the defect can be prevented.

Second Embodiment (Misplacement Map Generating Method)

As the dimensions of a pattern formed in a mask has become narrowed, it is necessary to detect the fine defect in the inspection process, and it is also necessary to map a distribution of the misplacement amount between the position coordinate of the pattern and the design position coordinate to feed back the map to the mask producing process. In the second embodiment, a method for generating an accurate misplacement map associated with the position of the pattern to be inspected in the mask will be described.

The misplacement map is generated by mapping the distribution of the misplacement amount between the position coordinate of the pattern to be inspected and the design position coordinate. In order to generate the accurate misplacement map, it is necessary to obtain the accurate misplacement amount.

The mask in which the misplacement map is generated is also the inspection target. In the second embodiment, the method for generating the misplacement map using the mask 101 according to the first embodiment will be described.

Figure 12:
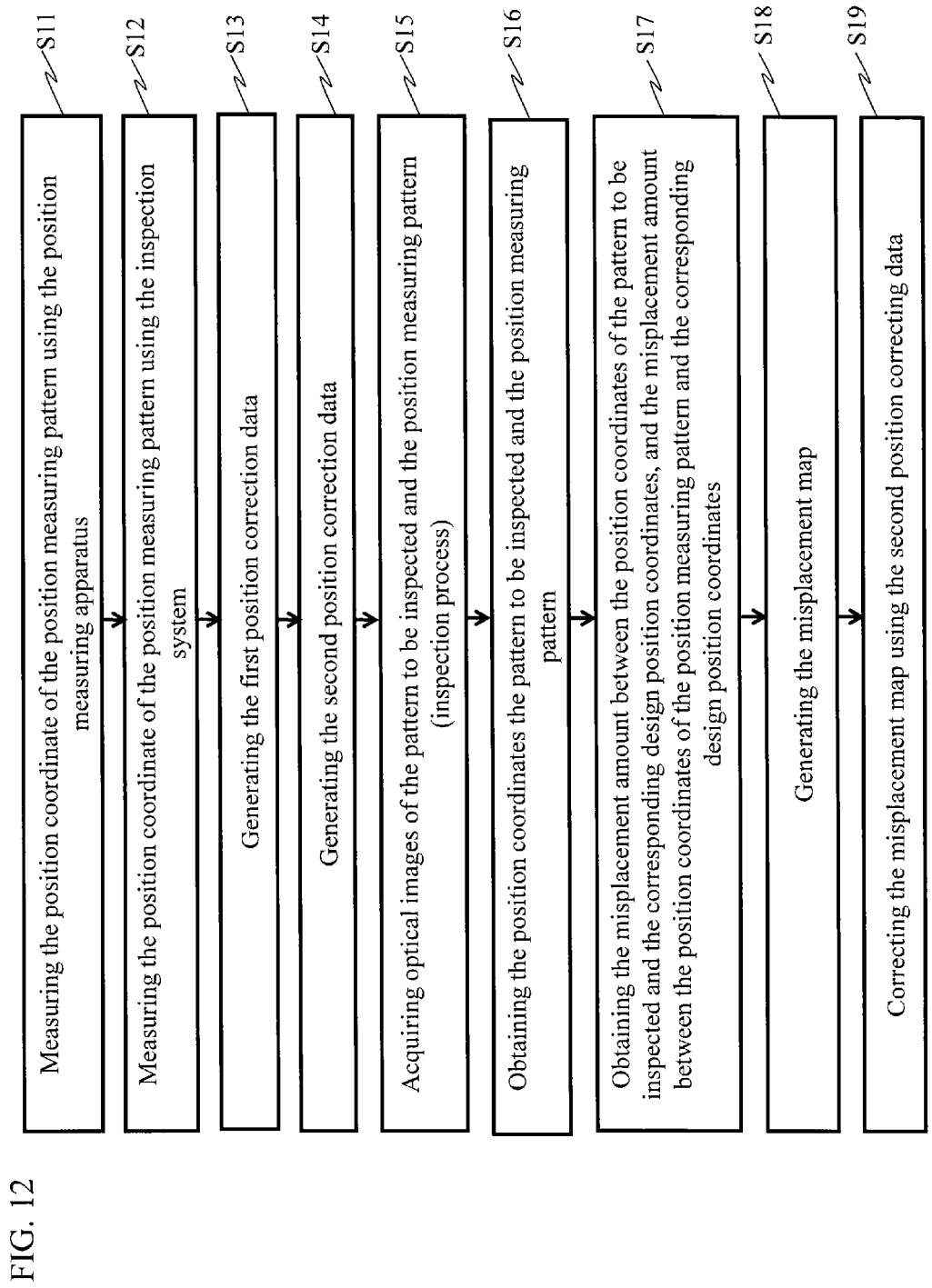
FIG. 12 is a flowchart of the misplacement map generating method according to the second embodiment.

FIG. 12 is a flowchart illustrating the misplacement map generating method according to the second embodiment. The first position correction data and second position correction data described in the first embodiment are used to accurately obtain the misplacement amount between the design position coordinate and the position coordinate of the pattern to be inspected. Thereby, S11 to S17 in FIG. 12 are similar to S1-1 to S1-7 in FIG. 11, respectively.

In S18, the misplacement map is generated from the misplacement amount between the design position coordinate and the position coordinate of the pattern to be inspected (obtained in S17), and the misplacement amount between the design position coordinate and the position measuring pattern. Because the measurement value of a position coordinate of the pattern to be inspected and the measurement value of a position coordinate of the position measuring pattern are obtained based on the optical image obtained in the inspection process, therefore these measurement values of position coordinates include an error caused by the environmental fluctuation in the inspection system. Thereby, the misplacement amount obtained from these measurement values of position coordinates and the misplacement map generated by mapping these misplacement amounts includes the error caused by environmental fluctuation, accordingly, the misplacement amount is corrected using the second position correction data (S19).

Next, the processes (S11 to S19) illustrated in FIG. 12 will be individually described in detail below.

In S11, the position coordinate of the position measuring pattern of the mask 101 is measured with the position measuring apparatus. The position measuring apparatus is an external apparatus of the inspection system that inspects the pattern to be inspected formed in the mask 101. For example, LMS-IPRO (a product of LEICA) is used as the position measuring apparatus.

In S11, it is not necessary to measure all of the position coordinates of the position measuring patterns arranged in the mask 101. The optical image of the position measuring pattern is acquired in each stripe that virtually divides the region where the pattern is arranged, and the position coordinates of the position measuring patterns located at the starting and ending points of the stripe may be measured in each stripe. Alternatively, the position coordinate of the position measuring pattern located at one of the starting and ending points of the stripe may be measured in each stripe.

In S12, the position coordinates of all the position measuring patterns arranged in the mask 101 are measured with the inspection system 100 illustrated in FIG. 8. Specifically, the mask 101 is positioned on the XYθ-table 102. Then, the position coordinate (x, y) of the XYθ-table 102 corresponding to the optical image is measured with the laser length-measuring system 122 while the optical image of the position measuring pattern is acquired. Thereby, the position coordinate (x, y) of the position measuring pattern is obtained. S12 is performed in advance of the inspection process of the pattern to be inspected.

In S13, the first position correction data 209a is generated based on the measurement value of a position coordinate of the position measuring pattern (obtained in S12). The position correction data generating circuit 125 in FIG. 8 generates the first position correction data 209a.

The position correction data generating circuit 125 generates the first position correction data 209a from the measurement value of a position coordinate of the position measuring pattern. The first position correction data 209a is generated by calculating the misplacement amount between the measurement value of a position coordinate of the position measuring pattern (obtained in S12), and the design coordinate of the position measuring pattern, and plotting the misplacement amount with respect to the position in the X-axis direction or Y-axis direction in each stripe of FIG. 10. The misplacement amount is a vector amount indicating the degree and the direction of the misplacement.

In S14, the second position correction data 209b is generated by correcting the first position correction data 209a (obtained in S13). Similarly to the first position correction data 209a, the position correction data generating circuit 125 in FIG. 8 generates the second position correction data 209b.

For example, the measurement value of a position coordinate of the position measuring pattern obtained in S11 is stored in, for example, the magnetic disk device 109 in FIG. 8. The control computer 110 reads the measurement value of a position coordinate of the position measuring pattern from the magnetic disk device 109, and sends the measurement value of a position coordinate to the position correction data generating circuit 125. The position correction data generating circuit 125 corrects the first position correction data 209a using the sent position measured coordinate from the magnetic disk device 109. The first position correction data 209a is corrected as follows.

For example, the measurement value of the position coordinate of the position measuring pattern measured with the position measuring apparatus is, for example, the measurement value of a position coordinate of the position measuring pattern located at each of the starting and ending points in each stripe shown in FIG. 10. Therefore, each position coordinate of the starting and ending points of the stripe is extracted in the first position correction data 209a, and then the difference between these position coordinates and each position coordinate of the starting and ending points of the stripe same as the measurement values measured by the position measuring apparatus are obtained. A value determined based on the difference is added to or subtracted from the position coordinate of the position measuring pattern located at the position except for the starting and ending points in the first position correction data 209a. For example, an average value of the difference at the starting point and the difference at the ending point is obtained in each stripe, and the obtained average value can be added to or subtracted from the position coordinate of the position measuring pattern in the corresponding stripe. Alternatively, in each stripe, the X-coordinates at the starting and ending points are taken on a horizontal axis, and the difference at the starting point and the difference at the ending point are taken on a vertical axis. A difference corresponding to each position coordinate of the position measuring pattern is obtained from a straight line obtained by linear interpolation of the two points in each stripe, and the difference may be added to or subtracted from the position coordinate of the position measuring pattern located at the position except for the starting and ending points in the first position correction data 209*a*.

In S15, the inspection system 100 acquires the optical image of the pattern to be inspected and the optical image of the position measuring pattern, and measures the position coordinate of the XYθ-table 102. This process (S15) is performed in the process of inspecting the defect of the pattern to be inspected.

A procedure for acquiring the optical image of the pattern to be inspected is similar to the procedure for acquiring the optical image of the pattern to be inspected explained using FIG. 10 in the first embodiment. In the present embodiment, the optical image of the position measuring pattern is acquired along with the optical image of the pattern to be inspected. In this case, the optical image of the inspection pattern can be acquired using both the transmitted light and the reflected light. It is desirable that the reflected light is used to obtain the optical image of the position measuring pattern to obtain both images at the same time. This is because, as described above in the first embodiment, the shape or size of the position measuring pattern are adjusted such that the position measuring pattern is not substantially transferred to the wafer using the transmitted light.

In FIG. 8, the photodiode array 105 performs the photoelectric conversion on the light incident to the photodiode array 105, and then the converted light is subjected to A/D (analog-to-digital) conversion by the sensor circuit 106. The optical image data 204 is sent from the sensor circuit 106 to the position coordinate and misplacement amount obtaining circuit 127. In this case, the optical image data 204 includes the data of the position measuring pattern and the data of the pattern to be inspected.

At the same time as the acquisition of the optical image data 204, the laser length-measuring system 122 measures the position coordinate of the XYθ-table 102 corresponding to the optical image data 204. After the measurement value of a position coordinate of the XYθ-table 102 is sent to the position circuit 107, it is read by the control computer 110, and sent to the position coordinate and misplacement amount obtaining circuit 127.

In S16, the position coordinate of the pattern to be inspected and the position coordinate of the position measuring pattern are obtained from the measurement value of a position coordinate of the XYθ-table 102 (obtained in S15) and the optical image. This process in S16 is performed by the position coordinate and misplacement amount obtaining circuit 127.

The position coordinate and misplacement amount obtaining circuit 127 obtains the position coordinate of the pattern to be inspected and the position coordinate of the position measuring pattern from the optical image data 204 and the measurement value of a position coordinate of the XYθ-table 102 acquired during the inspection process. Specifically, the process in S16 is performed as follows. Firstly, the optical image data obtained in units of stripes is divided into small regions called blocks (or frames). Then, a predetermined region of the optical image is compared with a reference image generated from the design data corresponding to the predetermined region, and the XYθ-table 102 is shifted parallel to the position where an absolute value of a difference value of the images or a square sum of a difference is minimized by pattern matching. The position coordinate of the pattern to be inspected is determined from the parallel shift amount, and from data recorded by laser length-measuring system 122 of the block.

In S17, the misplacement amount between the design position coordinate and the position coordinate of the pattern to be inspected (obtained in S16) is obtained, and the misplacement amount between the design position coordinate and the position coordinate of the position measuring pattern (obtained in S16) is also obtained. The process is performed by the position coordinate and misplacement amount obtaining circuit 127. As described above in the first embodiment, the design position coordinates of the pattern to be inspected and position measuring pattern can be obtained from the reference images generated from the design data of these patterns. A value in which an absolute value of a difference value of the coordinate position between the optical images and the corresponding reference images or a square sum of a difference is minimized can be used as the misplacement amounts of the pattern to be inspected and position measuring pattern.

In S18, the map (misplacement map) indicating the distribution of the misplacement amount (obtained in S17) is generated. This process in S18 is performed by the map generating circuit 126.

Specifically, as illustrated in FIG. 9, the misplacement amount data from the position coordinate and misplacement amount obtaining circuit 127, and the position coordinate of the XYθ-table 102 read from the position circuit 107 by the control computer 110 is individually sent to the map generating circuit 126. The map generating circuit 126 plots the misplacement amount sent from the position coordinate and misplacement amount obtaining circuit 127 while associating the misplacement amount with the position coordinate on the surface of the mask 101, that is, the position in the X-axis direction or Y-axis direction, thereby generating the misplacement map 210 (the measurement value of the misplacement map).

For example, the whole pattern to be inspected is divided into plural unit regions. The unit region includes a predetermined region and a plurality of regions each of which is located near the predetermined region and has the size identical to that of the predetermined region. The value, in which the absolute value of a difference between the predetermined region of the optical image of the pattern to be inspected, and the reference image corresponding to the predetermined region or the square sum of the difference is minimized, is obtained in each unit region. The value, in which the absolute value of a difference between the predetermined region of the optical image and the reference image corresponding to the optical image or the square sum of the difference is minimized, is also obtained with respect to each of the plurality of regions each of which is located near the predetermined region and has the size identical to that of the predetermined region. Then, the average value of these values is obtained, and the map is generated with the average value as the misplacement amount in each unit region. The value in which the misplacement amount data 208 is averaged by the position coordinate and misplacement amount obtaining circuit 127 in FIG. 9 corresponds to the average value mentioned here.

In S19, the misplacement map 210 generated in S18 is corrected using the second position correction data 209*b* generated in S14.

For example, the misplacement map 210 is corrected as follows. As illustrated in FIG. 9, the position correction data generating circuit 125 sends the second position correction data 209*b* to the map generating circuit 126. The difference between the misplacement map 210 and the second position correction data 209*b* is obtained to obtain the true value of the misplacement amount with respect to each position measuring pattern. The true value is added to or subtracted from the misplacement amount of the pattern to be inspected constituting the misplacement map 210 to correct the misplacement amount of the pattern to be inspected, thereby obtaining the true value of the misplacement amount of the pattern to be inspected. Accordingly, the corrected misplacement map 211, namely, the misplacement map in which the accurate misplacement amount is known can be obtained by mapping the true value of the misplacement amount of the pattern to be inspected. The corrected misplacement map 211, in which the accurate misplacement amount between the position coordinate of the pattern to be inspected and the design coordinate is mapped, is fed back to the production process of the mask 101 and used to adjust the photolithography condition.

A relationship between the misplacement map generated in S18 of FIG. 12, the first position correction data and second position correction data, and the misplacement map corrected using the second position correction data will be described below with reference to FIG. 13.

Figure 13:
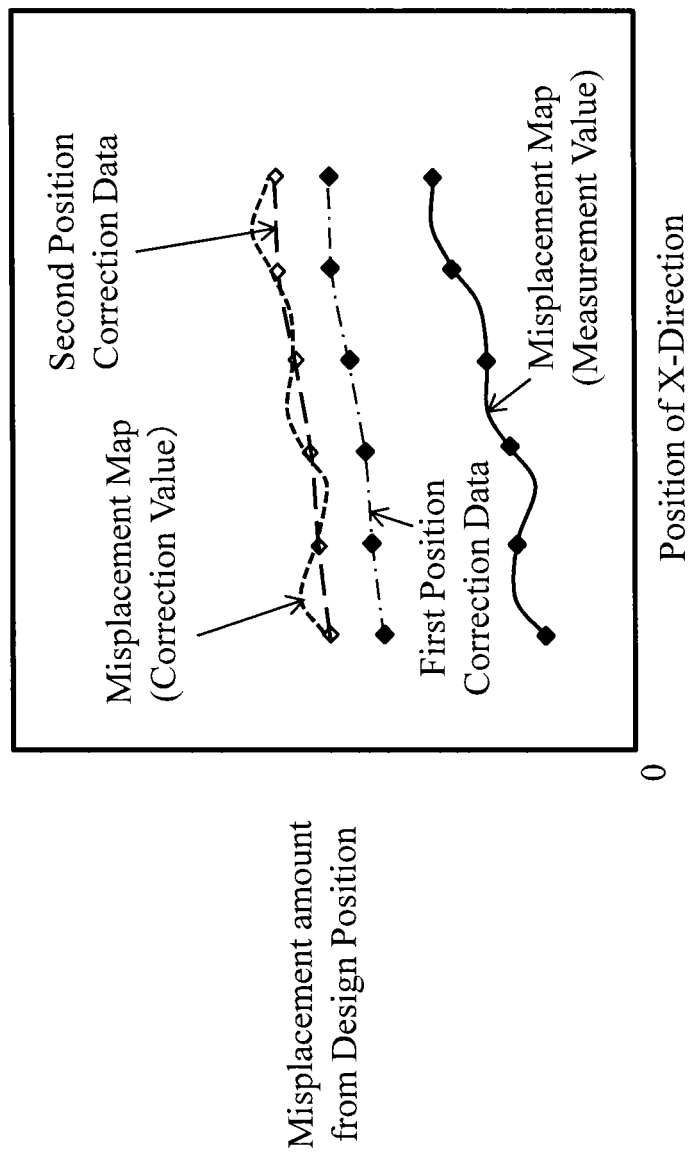
FIG. 13 is one example of the misplacement map according to the second embodiment.

The solid line in FIG. 13 indicates the measurement value of the misplacement map of the pattern to be inspected and position measuring pattern. The solid line in FIG. 13 corresponds to the misplacement map generated in S18 of FIG. 12.

An alternate long and short dash line in FIG. 13 indicates the first position correction data, and a broken line indicates the second position correction data. Both the alternate long and short dash line and the broken line indicate a relationship between the X-coordinate and the misplacement amount when the Y-coordinate is specified on the XY-plane, and each point indicates the misplacement amount of the position measuring pattern.

As described above, the misplacement amount of the position measuring pattern constituting the solid-line misplacement map is obtained using the optical image of the position measuring pattern. Similarly, the misplacement amount of the position measuring pattern constituting the first position correction data is obtained using the optical image of the position measuring pattern. Accordingly, because identical position measuring patterns are obtained at the identical X-coordinate as shown in FIG. 13, the identical position coordinate and the identical misplacement amount are obtained in principle. However, because of the fluctuation of the measurement result obtained in the inspection process by the length-measuring system, a difference is generated between the measurement result obtained by the length-measuring system and the measurement result obtained in advance of the inspection, and the solid line and the alternate long and short dash line are obtained as illustrated in FIG. 13.

The fluctuation of the measurement result is also generated at the position of the pattern to be inspected. The solid line in FIG. 13 is not an accurate misplacement map, because the map is not generated based on the accurate misplacement amount. Therefore, the proper photolithography condition can hardly be adjusted even if the misplacement map indicated by the solid line in FIG. 13 is fed back to the production process of the mask 101.

Although it is necessary to correct the solid-line misplacement map, the first position correction data 209a also includes the measurement error because the first position correction data 209a is generated from the position coordinate measured with the inspection system 100. Thereby, the solid-line misplacement map is corrected using the second position correction data 209b that is obtained by correcting the first position correction data 209a. A dotted line in FIG. 13 indicates a correction value of the misplacement map.

The correction value of the misplacement map indicated by the dotted line in FIG. 13 correctly reflects the misplacement amount between the position coordinate of the pattern to be inspected and the design position coordinate, so that a semiconductor element producing yield can be improved by feeding back the correction value to the semiconductor element production process.

Third Embodiment (Inspection System)

FIG. 8 is a schematic configuration diagram of an inspection system according to the present embodiment. FIG. 9 is a view illustrating a data flow in the inspection system of FIG. 8.

The inspection system of the third embodiment includes an inspection function for detecting the defect of the pattern to be inspected, a function of measuring the position of the pattern to be inspected, and a misplacement map generating function for generating the map of the misplacement amount from the design value of the pattern to be inspected. The position measuring function is already described in the first embodiment, and the misplacement map generating function is already described in the second embodiment. Therefore, the inspection function will mainly be described below. Similarly to the first and second embodiments, in the third embodiment, the mask 101 is used as the inspection target.

The optical image data 204 of the mask 101 acquired by the configuration unit A in FIG. 8 is sent from the sensor circuit 106 to the comparison circuit 108 as illustrated in FIG. 9. The reference image data 206 is also sent from the reference image generating circuit 112 to the comparison circuit 108. Further, the data indicating the position of the mask 101 on the XYθ-table 102, which is output from the position circuit 107, is also sent to the comparison circuit 108.

The comparison circuit 108 compares the optical image data 204 to the reference image data 206 based on the design data corresponding to the optical image data 204. When the difference value between the optical image data 204 and the reference image data 206 is larger than a predetermined threshold value, the comparison circuit 108 determines that the defect exists in the pattern to be inspected. A specific example of the inspection by a die-to-database comparison method will be described below.

In the die-to-database comparison method, the reference image data is used as a standard of the defect inspection for the optical image data. In the case where the optical image of the pattern to be inspected is obtained through the transmission illumination system, transmission image data is compared with each other. In FIG. 8, the mask 101 is irradiated with the light emitted from the light source 103a, through the transmission illumination optical system 170a, and the light is then incident on the photodiode array 105 through the magnifying optical system 104 arranged below the mask 101, thereby obtaining the transmission image data. On the other hand, in the configuration of the reflection illumination system, reflection image data is compared with each other. In the case where the transmission image and the reflection image are obtained by a combination of the transmission illumination system and the reflection illumination system, the transmission image data are compared with each other and the reflection image data are compared with each other. The shape defect of the pattern to be inspected is detected by the comparison. A specific comparison method will be described below.

The graphics included in the pattern data of the design intermediate data 202 in FIG. 9 are formed based on a rectangle and a triangle. Graphic data (geometrical data) in which the shape, size, and position of each pattern graphic are defined is stored in the magnetic disk device 109. The graphic data (geometrical data) is information such as the coordinate (x, y) at the reference position of the graphic, a length of a side, and a graphic code (geometrical code) constituting an identifier discriminating a type of graphic such as the rectangle and the triangle. Data hierarchized using a cluster (or cell) is arranged in the stripe, and the stripe is divided into proper sizes, and a sub-stripe is formed. The sub-stripe extracted from the optical image and the sub-stripe extracted from the reference image corresponding to the optical image are input to a comparison unit of the comparison circuit 108.

The sub-stripe input to the comparison circuit 108 is further divided into small rectangular regions called inspection frames. The comparison unit compares the inspection frames to each other to detect the defect. The comparison circuit 108 includes several tens of comparison units such that the plural inspection frames are concurrently processed. Each comparison unit captures the unprocessed frame image in sequence as soon as the processing of one inspection frame is ended. Thereby, the many inspection frames are sequentially processed.

Specifically, the processing of the comparison unit is performed as follows. Firstly, the optical image and the reference image are aligned with each other. In this case, in order that the edge positions of the patterns or the positions of brightness peaks are aligned with each other, the parallel shift is performed in units of pixels, and a proportional distribution of a brightness value of adjacent pixel is performed to align regions smaller than one pixel with each other. After the position alignment, the defect is detected according to a proper comparison and determination algorithm by evaluating a level difference between the optical image and the reference image in each pixel, or comparing derivatives of the pixels in a pattern edge direction to each other. Specifically, in the comparison and determination algorithm, the transmission image data, the reflection image data, or the combination of the transmission image data and the reflection image data is used. As a result of comparison, in the case where the difference is larger than a defect determination threshold value, it is determined that a defect exists at this point. For example, the difference is a difference between the position or shape of the pattern. According to the third embodiment, because the accurate position of the optical image is obtained, the alignment of the optical image with the reference image can be accurately performed, and thereby the defect determination can accurately be made.

As shown in FIG. 9, as a result of the comparison with the reference image data 206 in the comparison circuit 108, when the defect of the pattern to be inspected is detected, the data is stored as a mask inspection result 205. Specifically, the defect coordinates and the optical image, which is the basis of the defect determination, are stored in the magnetic disk device 109 as a mask inspection result 205 by the control computer 110.

After that, the mask inspection result 205 is transmitted to a review tool 500 that is an external device of the inspection system 100, illustrated in FIG. 9. The review tool can be provided as one component of the inspection system 100.

A review process is an operation in which the operator determines whether the detected defect will become a potential problem. For example, the operator visually determines whether the defect needs to be repaired by comparing the reference image, that is the basis for the defect determination, with the optical image including the defect. The defect information determined through the review process is also stored in the magnetic disk device 109 of FIG. 8. As illustrated in FIG. 9, when at least one defect to be repaired is confirmed by the review tool 500, the mask 101 is transmitted to a repair device 600. Because a repair method depends on whether the defect is projected or recessed, a defect type including the distinction between the projection and the recess and the defect coordinate are added to the defect information list 207.

The present invention is not limited to the first to third embodiments, but various modifications can be made without departing from the scope of the present invention. In the above embodiment, by way of example, the inspection is performed by the die-to-database comparison method. Alternatively, the inspection may be performed by a die-to-die comparison method or a cell comparison method. Alternatively, in the same fashion as the inspection of a template in NanoImprint Lithography (NIL), a specific pixel in one image may be compared with a pixel around the specific pixel.

The above description of the present embodiment has not specified apparatus constructions, control methods, etc., which are not essential to the description of the invention, since any suitable apparatus construction, control methods, etc. can be employed to implement the invention. Further, the scope of this invention encompasses all position measuring methods, misalignment map generating methods, and inspection systems employing the elements of the invention and variations thereof, which can be designed by those skilled in the art.

What is claimed is:

1. A position measuring method comprising:
preparing a mask including a plurality of first patterns to be transferred to a subject and a plurality of second patterns which are positioning measuring patterns, each position measuring pattern being formed in a region surrounding the region where the plurality of first patterns are formed and also formed in another region where a pattern to be inspected is formed in the mask, the plurality of first patterns being geometrical patterns to be transferred to the subject;
measuring position coordinates of the plurality of second patterns with a position measuring apparatus;
measuring position coordinates of the plurality of second patterns with an inspection system;
generating first position correction data based on the position coordinates of the plurality of second patterns measured with the inspection system;
obtaining a difference between the position coordinates of the plurality of second patterns measured with the position measuring apparatus and the position coordinates of the plurality of second patterns measured with the inspection system;
correcting the first position correction data using the obtained difference;
generating second position correction data from the corrected first position correction data;
acquiring an optical image including the position coordinates of the plurality of first patterns and the position coordinates of the plurality of second patterns; and
correcting the position coordinates of the plurality of first patterns of the optical image using a difference between the position coordinates of the plurality of second patterns of the optical image and the position coordinates of the plurality of second patterns based on the second position correction data.

2. The position measuring method according to claim 1, wherein the first position correction data is generated by interpolating and associating the plurality of position coordinates using the position coordinates of the plurality of second patterns measured with the inspection system.

3. A position measuring method comprising:

preparing a mask including a plurality of first patterns to be transferred to a subject and a plurality of second patterns, wherein the plurality of second patterns are arranged in a region where the plurality of first patterns are arranged, and in a region surrounding the region where the plurality of first patterns are arranged, the plurality of second patterns being position measuring patterns, each position measuring pattern being also formed in another region where a pattern to be inspected is formed in the mask, the plurality of first patterns being geometrical patterns to be transferred to the subject;

measuring position coordinates of the second patterns with a position measuring apparatus;

positioning the mask on a table configured to be movable in an X-axis direction and a Y-axis direction, acquiring optical images of the plurality of second patterns while measuring a position coordinate of the table, and generating first position correction data with respect to the plurality of first patterns based on a measurement value obtained by measuring position coordinates of the plurality of second patterns;

correcting the first position correction data based on the position coordinates of the plurality of second patterns measured with the position measuring apparatus;

generating second position correction data based on the corrected first position correction data;

acquiring optical images of the plurality of first patterns and optical images of the plurality of second patterns while measuring the position coordinate of the table during a defect inspection of the plurality of first patterns;

obtaining the position coordinates of the plurality of first patterns and the position coordinates of the plurality of second patterns from the position coordinate of the table, the optical images of the plurality of first patterns, and the optical images of the plurality of second patterns;

generating a plurality of reference images based on design data corresponding to the plurality of first patterns, and a plurality of reference images based on design data corresponding to the plurality of second patterns;

obtaining the position coordinates of the plurality of first patterns from the reference images of the plurality of first patterns, and the position coordinates of the plurality of second patterns from the reference images of the plurality of second patterns;

obtaining misplacement amounts of the plurality of first patterns between the position coordinates obtained from the optical images and the position coordinates obtained from the reference images, and misplacement amounts of the plurality of second patterns between the position coordinates obtained from the optical images and the position coordinates obtained from the reference images;

obtaining a difference between the misplacement amounts of the plurality of second patterns and the misplacement amounts of the plurality of second patterns of the second position correction data, and adding the difference to or subtracting the difference from the misplacement amounts of the plurality of first patterns to correct the misplacement amounts of the plurality of first patterns; and correcting the position coordinates of the plurality of first patterns using the corrected misplacement amounts, and setting a position of the first pattern to the corrected position.

4. The position measuring method according to claim 3, wherein the first position correction data is obtained by acquiring the optical images of the plurality of second patterns, and plotting X-coordinate positions and Y-coordinate positions of the plurality of second patterns on an XY-coordinate, and wherein the generating step for the second position correction data comprises:

obtaining a difference between position coordinates at starting and ending points on the XY-coordinate of the first position correction data and position coordinates at identical starting and ending points measured with the position measuring apparatus, and correcting the first position correction data using the obtained difference;

generating second position correction data from the corrected first position correction data.

5. The position measuring method according to claim 1, wherein the plurality of first patterns are geometrical patterns to be transferred to the subject using transmitted light, and the plurality of second patterns are position measuring patterns in which intensity of the transmitted light is adjusted such that the plurality of second patterns are not substantially transferred to the subject.

6. The position measuring method according to claim 3, wherein the plurality of first patterns are geometrical patterns to be transferred to the subject using transmitted light, and the plurality of second patterns are position measuring patterns in which intensity of the transmitted light is adjusted such that the plurality of second patterns are not substantially transferred to the subject.

7. The position measuring method according to claim 1, wherein the acquiring step for the optical image comprises:

repeating a plurality of times the acquisition of the optical images while measuring the position coordinates of the table, and wherein the generating step for the first position correction data comprises, obtaining an average value of each X-coordinate and an average value of each Y-coordinate of the table from the position coordinates of the table measured by the repeating step, obtaining each position coordinate of the plurality of second patterns from the average value of each X-coordinate and average value of each Y-coordinate, and from the optical image of the plurality of second patterns acquired by the repeating step, and generating the first position correction data from each position coordinate of the plurality of second patterns.

8. The position measuring method according to claim 3, wherein the acquiring step for the optical image comprises:

repeating a plurality of times the acquisition of the optical images while measuring the position coordinates of the table, and wherein the generating step for the first position correction data comprises, obtaining an average value of each X-coordinate and an average value of each Y-coordinate of the table from the position coordinates of the table measured by the repeating step, obtaining each position coordinate of the plurality of second patterns from the average value of each X-coordinate and average value of each Y-coordinate, and from the optical image of the plurality of second patterns acquired by the repeating step, and generating the first position correction data from each position coordinate of the plurality of second patterns.

9. A misalignment map generating method comprising:

preparing a mask including a plurality of first patterns to be transferred to a subject and a plurality of second patterns, wherein the plurality of second patterns are arranged in a region where the plurality of first patterns are arranged, and in a region surrounding the region where the plurality of first patterns are arranged, the plurality of second patterns being position measuring patterns, each position measuring pattern being also formed in another region where a pattern to be inspected is formed in the mask, the plurality of first patterns being geometrical patterns to be transferred to the subject;

measuring position coordinates of the second patterns with a position measuring apparatus;

positioning the mask on a table configured to be movable in an X-axis direction and a Y-axis direction, acquiring optical images of the plurality of second patterns while measuring a position coordinate of the table, and generating first position correction data with respect to the plurality of first patterns based on a measurement value obtained by measuring position coordinates of the plurality of second patterns;

correcting the first position correction data based on the position coordinates of the plurality of second patterns measured with the position measuring apparatus;

generating second position correction data from the corrected first position correction data;

acquiring optical images of the plurality of first patterns and optical images of the plurality of second patterns while measuring the position coordinate of the table during a defect inspection of the plurality of first patterns;

obtaining the position coordinates of the plurality of first patterns and the position coordinates of the plurality of second patterns from the position coordinate of the table, the optical images of the plurality of first patterns, and the optical images of the plurality of second patterns;

generating a map of the misplacement amount from the design coordinates of the pluralities of first and second patterns, the misplacement amounts being associated with the position coordinates on the surface of the mask; and obtaining a difference between the misplacement amount from the map of the misplacement amount and the misplacement amount of the second position correction data with respect to the plurality of second patterns, and adding the difference to or subtracting the difference from the misplacement amounts of the plurality of first patterns to correct the map of the misplacement amount.

10. The misalignment map generating method according to claim 9, wherein the plurality of first patterns are geometrical patterns to be transferred to the subject using transmitted light, and the plurality of second patterns are position measuring patterns in which intensity of the transmitted light is adjusted such that the plurality of second patterns are not substantially transferred to the subject.

11. The misplacement map generating method according to claim 9, further comprising:

generating a reference image corresponding to the optical image of the first pattern from design data of the first pattern, and generating a reference image corresponding to the optical image of the second pattern from design data of the second pattern, wherein the misplacement amount is a value in which an absolute value of a difference between a predetermined region of the optical image and the reference image corresponding to the predetermined region or a square sum of the difference is minimized.

12. The misplacement map generating method according to claim 9, wherein the generating step of the map of the misplacement amount comprises:

dividing the plurality of first patterns into a plurality of unit regions, wherein the unit region includes a plurality of regions that are identically sized, and wherein one of the regions is a predetermined region surrounded by other regions;

obtaining a value in which an absolute value of a difference between the predetermined region of the optical image of the first pattern and the reference image corresponding to the predetermined region or a square sum of the difference is minimized in each unit region, and obtaining a value in which an absolute value of a difference between the optical image and the reference image corresponding to the optical image or a square sum of the difference is minimized in each region with respect to the plurality of regions each identically sized to that of the predetermined region, and each region surrounding the predetermined region, and acquiring an average value of these values; and setting the average value to the misplacement amount in each unit region to generate the map of misplacement amount.

13. An inspection system comprising:

a table configured to be movable in an X-axis direction and a Y-axis direction;

a position measuring device configured to measure a position coordinate of the table;

an optical image acquiring device configured to acquire an optical image of an inspection target on the table;

a reference image generator configured to generate a reference image corresponding to the optical image from design data of a pattern arranged in the inspection target;

a map generator configured to obtain position coordinates of a plurality of first patterns and position coordinates of a plurality of second patterns from optical images of a plurality of first patterns of the inspection target, and optical images of a plurality of second patterns, wherein the plurality of second patterns are arranged in a region where the plurality of first patterns are arranged, and in a region surrounding the region where the plurality of first patterns are arranged, and the position coordinate of the table measured during acquisition of these optical images, and generate a map of the misplacement amounts of each position coordinate of the plurality of first patterns and the plurality of second patterns from design coordinates, the misplacement amounts being associated with position coordinates on the surface of the inspection target in the map of the misplacement amount;

a position correction data generator configured to generate first position correction data with respect to the plurality of first patterns by calculating the misplacement amounts between the optical images of the plurality of second patterns, the optical images of the plurality of second patterns acquired separately from the plurality of first patterns, and the reference image generated from design data of the second pattern corresponding to the optical image, and generate second position correction data by correcting the first position correction data based on the position coordinate of the second pattern measured with a position measuring apparatus, the plurality of second patterns being position measuring patterns, each position measuring pattern being also formed in another region where a pattern to be inspected is formed in the mask, the plurality of first patterns being geometrical patterns to be transferred to the subject;

a map corrector that is a part of the map generator or that is independent from the map generator, the map corrector being configured to obtain a difference between the misplacement amount from the map of the misplacement amount and the misplacement amount from the second position correction data with respect to the plurality of second patterns, and correct the map of the misplacement amount by adding the difference to or subtracting the difference from the misplacement amounts of the plurality of first patterns; and a comparator configured to compare the optical image of the first pattern with the reference image of the first pattern, and determine the existence of a defect in the case where a difference value between the optical image and the reference image is larger than a predetermined threshold value.

* * * * *